United States Patent [19]

Iwamoto et al.

[11] Patent Number: 5,592,434
[45] Date of Patent: Jan. 7, 1997

[54] SYNCHRONOUS SEMICONDUCTOR MEMORY DEVICE

[75] Inventors: Hisashi Iwamoto; Yasuhiro Konishi; Katsumi Dosaka; Yasumitsu Murai, all of Hyogo, Japan

[73] Assignee: Mitsubishi Denki Kabushiki Kaisha, Tokyo, Japan

[21] Appl. No.: 548,285

[22] Filed: Oct. 25, 1995

[30] Foreign Application Priority Data

Dec. 15, 1994 [JP] Japan ..................................... 6-311842
Jan. 30, 1995 [JP] Japan ..................................... 7-013048

[51] Int. Cl.$^6$ ................................................... G11C 7/00
[52] U.S. Cl. ............... 365/233; 365/230.03; 365/189.01
[58] Field of Search ............................. 365/233, 230.03, 365/230.01, 189.01

[56] References Cited

U.S. PATENT DOCUMENTS 5,471,430 11/1995 Sawada et al. ......................... 365/233
5,517,462 5/1996 Iwamoto et al. ....................... 365/233

OTHER PUBLICATIONS

"250 Mbyte/sec Synchronous DRAM Using a 3–State–Pipelined Architecture" Takai et al., '93 Symp. on VLSI circuit pp. 59–60.
"16 Mbit Synchronous DRAM with 125 Mbyte/sec Data Rate" Choi et al., 93 Symp. on VLSI circuit pp. 65–66.
"A 150–MHz–4–Bank 64 M–bit SDRAM with Address Incrementing Pipeline Scheme" Kodama et al., 1994 Symposium on VLSI Circuits Digest of Technical Papers pp. 81–82.

Primary Examiner—David C. Nelms
Assistant Examiner—Vu A. Le
Attorney, Agent, or Firm—Lowe, Price, LeBlanc & Becker

[57] ABSTRACT

To one memory array, global signal input/output line pairs in two systems, a switch for connecting the global IO line pairs to a write buffer group alternately on a clock cycle basis, and another switch for connecting the global IO line pairs to an equalize circuit alternately on a clock cycle basis are provided. During one clock cycle, writing of data through one global IO line pair and equalization of the other global IO line pair can be carried out in parallel. Therefore, data can be written easily at a high frequency.

19 Claims, 33 Drawing Sheets

CONTINUOUS WRITING OPERATION
(BURST LENGTH=8)

RANDOM WRITING OPERATION

CONTINUOUS WRITING OPERATION (BURST LENGTH=4)

SYNCHRONOUS SEMICONDUCTOR MEMORY DEVICE

BACKGROUND OF THE INVENTION

1. Field of the Invention

The present invention relates to synchronous semiconductor memory devices, and more particularly, to a synchronous semiconductor memory device which strobes external signals including a control signal, an address signal and a data signal in synchronization with an external clock signal.

2. Description of the Background Art

A dynamic random access memory (hereinafter referred to as a "DRAM") which is employed as a main memory cannot follow a microprocessor (hereinafter referred to as an "MPU") in operating speed although its operation has been speeded up. Therefore, it is frequently pointed out that an access time and a cycle time of such a DRAM bottleneck the operation of the overall system, to deteriorate its performance. It has been proposed in recent years to employ as a main memory for a high speed MPU a synchronous DRAM (hereinafter referred to as an "SDRAM") which operates in synchronization with a clock signal. Takai et al. read a paper on an SDRAM of pipeline operation carrying out writing of data on a bit basis (Symposium on VLSI circuit, 1993), and Choi et al. read a paper on an SDRAM of 2-bit prefetch carrying out writing of data on a 2-bit basis (Symposium on VLSI circuit, 1993). Description will be given hereinafter of the SDRAM of pipeline operation and the SDRAM of 2-bit prefetch.

FIG. 19 is a block diagram functionally showing a structure of a main part in a conventional SDRAM of pipeline operation. FIG. 19 shows a structure of a functional portion which is related to 1-bit data input/output of the SDRAM having a by 8-bit structure. An array part which is related to a data input/output terminal DQi includes memory arrays 51a and 51b forming banks #1 and #2 respectively.

With respect to memory array 51a forming bank #1, there is provided an X decoder group 52a including a plurality of row decoders for decoding address signals X0 to Xj and selecting a corresponding row of memory array 51a, a Y decoder group 53a including a plurality of column decoders for decoding column address signals Y3 to Yk and generating column selection signals selecting corresponding columns of memory array 51a, and a sense amplifier group 54a for detecting and amplifying data of memory cells which are connected to the selected row of memory array 51a.

X decoder group 52a includes the row decoders which are provided in correspondence to respective word lines of memory array 51a. Row decoders are selected in accordance with address signals X0 to Xj, so that the word lines provided for the selected row decoders are selected.

Y decoder group 53a includes the column decoders which are provided for the respective column selection lines of memory array 51a. A single column selection line brings eight pairs of bit lines into selected states. X decoder group 52a and Y decoder group 53a simultaneously bring 8-bit memory cells into selected states in memory array 51a. X decoder group 52a and Y decoder group 53a are both activated by a bank specifying signal B1.

Bank #1 is further provided with a bus GIO as internal data transmission lines (global IO lines) for transmitting data which are detected and amplified by sense amplifier group 54a and transmitting write data to selected memory cells of memory array 51a. Global IO line bus GIO includes eight pairs of global IO lines for simultaneously transferring and receiving data to and from simultaneously selected 8-bit memory cells.

In order to read data, bank #1 is provided with a preamplifier group 55a which is activated in response to a preamplifier activation signal φPA1 for amplifying data on global IO line bus GIO, a read register 56a for storing data amplified in preamplifier group 55a, and an output buffer 57a for successively outputting the data stored in read register 56a.

Each of preamplifier group 55a and read register 56a has a structure of an 8-bit width in correspondence to the eight pairs of global IO lines. Read register 56a latches the data outputted from preamplifier group 55a to successively output the same in response to a register activation signal φRr1.

Output buffer 57a transmits the 8-bit data successively outputted from read register 56a to data input/output terminal DQi in response to an output enable signal φOE1. Referring to FIG. 19, data input/output terminal DQi is adapted to input and output the data. Alternatively, the data may be inputted and outputted through separate terminals.

In order to write data, on the other hand, bank #1 is further provided with an input buffer 58a of a 1-bit width which is activated in response to an input buffer activation signal φDB1 for generating internal write data from input data supplied to data input/output terminal DQi, a write register 59a which is activated in response to a register activation signal φRw1 for successively storing write data received from input buffer 58a (in accordance with wrap addresses), a write buffer group 60a which is activated in response to a write buffer activation signal φWB1 for amplifying and transmitting the data stored in write register 59a to global IO line bus GIO, and an equalize circuit group 61a equalizing global IO line pair bus G10.

Each of write buffer group 60a and write register 59a has an 8-bit width.

Similarly to the above, bank #2 includes memory array 51b, an X decoder group 52b, a Y decoder group 53b, a sense amplifier group 54b which is activated in response to a sense amplifier activation signal φSA2, a preamplifier group 55b which is activated in response to a preamplifier activation signal φPA2, a read register 56b which is activated in response to a register activation signal φRr2, an output buffer 57b which is activated in response to an output enable signal φOE2, an equalize circuit group 61b which is activated in response to an equalize circuit activation signal φEQ2, a write buffer group 60b which is activated in response to a buffer activation signal φWB2, a write register 59b which is activated in response to a register activation signal φRw2, and an input buffer 58b which is activated in response to a buffer activation signal φDB2.

Banks #1 and #2 are identical in structure to each other. Due to read registers 56a and 56b and write registers 59a and 59b, it is possible to input/output data in synchronization with a high-speed clock signal through a single data input/output terminal DQi.

As to control signals for banks #1 and #2, only those for either bank are generated in accordance with a bank specifying signal B1 or B2.

A functional block 300 shown in FIG. 19 is provided for each data input/output terminal. The SDRAM of the by 8-bit structure includes eight such functional blocks 300.

Since banks #1 and #2 are substantially identical in structure to each other, it is possible to drive banks #1 and #2 substantially independently of each other by activating only one of these banks by bank specifying signal B1 or B2.

Further, banks #1 and #2 are respectively provided with data read registers 56a and 56b and data write registers 59a and 59b independently of each other, whereby it is possible to correctly read and write data with no collision in switching between data read and write operation modes as well as in switching between banks #1 and #2.

First and second control signal generation circuits 62 and 63 and a clock counter 64 are provided as control systems for independently driving banks #1 and #2 respectively.

First control signal generation circuit 62 takes in externally applied control signals, i.e., an external row address strobe signal ext./RAS ("1" before reference characters indicating signals indicates that the signal is active at a low level in the specification and the drawings), an external column address strobe signal ext./CAS, an external output enable signal ext./OE, an external write enable signal (write authorization signal) ext./WE and a mask command signal WM in synchronization with an external clock signal CLK which is a system clock, for example, to generate internal control signals $\phi xa$, $\phi ya$, $\phi W$, $\phi O$, $\phi R$ and $\phi C$.

Second control signal generation circuit 63 generates control signals for independently driving banks #1 and #2 respectively, i.e., equalize circuit activation signals $\phi EQ1$ and $\phi EQ2$, sense amplifier activation signals $\phi SA1$ and $\phi SA2$, preamplifier activation signals $\phi PA1$ and $\phi PA2$, write buffer activation signals $\phi WB1$ and $\phi WB2$, input buffer activation signals $\phi DB1$ and $\phi DB2$, and output buffer activation signals $\phi OE1$ and $\phi OE2$ in response to bank specifying signals B1 and B2, internal control signals $\phi W$, $\phi O$, $\phi R$ and $\phi C$, and the output of clock counter 64.

The SDRAM further includes, as peripheral circuits, an X address buffer 65 which takes in external address signals ext./A0 to ext./Ai in response to internal control signal $\phi xa$ to generate internal address signals X0 to Xj and bank selection signals B1 and B2, a Y address buffer 66 which is activated in response to internal control signal $\phi ya$ for generating column selection signals Y3 to Yk for specifying column selection lines, wrap address bits Y0 to Y2 for specifying a first bit line pair (column) in a continuous access operation, and bank specifying signals B1 and B2, and a register control circuit 67 which generates wrap addresses WY0 to WY7, register activation signals $\phi Rr1$ and $\phi Rr2$ for controlling read registers 56a and 56b, and register activation signals $\phi Rw1$ and $\phi Rw2$ for driving write registers 59a and 59b.

Register control circuit 67 is supplied with bank specifying signal B1 or B2, to generate the register driving signal for only the selected bank.

FIG. 20 illustrates a chip layout of the conventional SDRAM. This figure shows a chip layout of a 16-megabit SDRAM having a 2 M word by 8 bit structure as an example.

The SDRAM includes four memory mats MM1 to MM4, each having 4-megabit storage capacity. Each of memory mats MM1 to MM4 includes 16 memory arrays MA1 to MA16 each having 256-K bit storage capacity.

Row decoders RD1 to RD4 are arranged on respective one sides of memory mats MM1 to MM4 along chip longer sides. Further, column decoders CD1 to CD4 are arranged on chip center sides of memory mats MM1 to MM4 along shorter sides respectively. At the output end of column decoder CD (symbol CD is adapted to generically indicate column decoders CD1 to CD4), column selection lines CSL extending across the respective arrays of the corresponding memory mat MM (symbol MM generically indicates memory mats MM1 to MM4) are provided. Each column selection line CSL simultaneously brings four pairs of bit lines into selected states.

Global IO line pairs GIO for transmitting internal data are arranged across the respective arrays along the longer sides of memory mats MM1 to MM4 respectively.

The respective memory mats MM1 to MM4 are further provided on the chip center sides thereof with input/output circuits PW1 to PW4, which are each formed by a preamplifier PA for amplifying data read from selected memory cells and a write buffer WB for transmitting write data to the selected memory cells.

A peripheral circuit PH including circuits for generating address and control signals is arranged on the chip central portion.

The SDRAM shown in FIG. 20 includes two banks #1 and #2 which can carry out precharge operations and activating operations (word line selecting, and sense and column selecting operations) independently of each other, as shown in FIG. 19. Bank #1 includes memory mats MM1 and MM2, while bank #2 includes memory mats MM3 and MM4. The number of banks #1 and #2 is changeable.

Each of memory mats MM1 to MM4 includes two array blocks each having 2-megabit storage capacity. One of the array blocks is formed by memory arrays MA1 to MA8, while the other array block is formed by memory arrays MA9 to MA16. A single memory array is selected at the maximum in each array block.

Four memory arrays are simultaneously activated. In other words, a single memory array is selected from each array block of each memory mat in the selected bank. For example, memory arrays MA16 and MA7, MA15 and MA8, MA14 and MA5, MA13 and MA6, MA12 and MA13, MA11 and MA4, MA10 and MA1, and MA9 and MA2 are activated in pairs. In FIG. 18, memory arrays MA7 and MA16 of memory mats MM3 and MM4 are activated respectively.

On the other hand, two column selection lines CSL are simultaneously selected. Each column selection line CSL selects four pairs of bit lines. Thus, 2×4=8 bit memory cells are selected at one time.

Input/output circuits PW are employed in common for the respective memory arrays of the corresponding memory mats MM. Each input/output circuit PW includes four preamplifiers PA and four write buffers WB. Namely, the overall SDRAM includes 16(=4×4) preamplifiers PA and 16 write buffers WB.

Preamplifiers PA and write buffers WB (input/output circuits PW) which are collectively arranged on the chip central portion are driven by control circuits included in peripheral circuit PH. Thus, signal lines for controlling operations of preamplifiers PA and write buffers WB are reduced in length, whereby loads on the signal lines can be reduced to implement a high-speed operation.

Since peripheral circuit PH is collectively arranged on the chip central portion, data are inputted/outputted through the chip central portion, whereby the data input/output terminals are arranged on a package central portion as to pin arrangement in packaging. Therefore, distances between peripheral circuit PH and the data input/output terminals are reduced to enable high-speed input/output of data.

FIG. 21 illustrates arrangement of IO lines in the SDRAM shown in FIG. 20. This figure shows two 2-megabit memory arrays MSA1 and MSA2. One 2-megabit memory array MSA2 is a 2-megabit array block which is arranged in a position separated from the chip central portion, while the other 2-megabit memory array MSA1 is a 2-megabit array block which is close to the chip central portion.

Each of 2-megabit memory arrays MSA1 and MSA2 includes 64 32-K bit memory arrays MK arranged in eight rows and eight columns. Word line shunt regions WS are provided between the 32-K bit memory arrays MK which are adjacent to each other along the word lines WL. In an ordinary DRAM, low-resistance metal wires of aluminum or the like are arranged in parallel with word lines WL of polysilicon, and the former are electrically connected with the latter at prescribed intervals in order to reduce resistances of the word lines. Regions for connecting the polysilicon word lines and the low-resistance metal wires are called word line shunt regions. No bit lines, i.e., no memory cells are present in the word line shunt regions, since it is necessary to connect the polysilicon word lines which are present under bit lines BL with low-resistance metal wire layers which are present above the bit lines.

One global IO line pair GIO is arranged along the longer side of memory mat MM. One global IO line pair is arranged in each of three word line shunt regions WS2, WS4 and WS6 of seven word line shunt regions WS1 to WS7 shown in FIG. 21. Two global IO line pairs are used by one 2 M bit memory array MSA.

Local IO line pairs LIO are provided in order to connect global IO line pairs GIO with a selected 256-K bit memory array MA. Two local IO line pairs LIO in total are arranged for each 256-K bit memory array MA so that one pair is arranged on one side and another pair is arranged on the other side. These local IO line pairs LIO are shared by two 256-K bit memory arrays MA adjacent to each other.

Block selecting switches BS are arranged in order to connect global IO line pairs GIO with local IO line pairs LIO. These block selecting switches BS are arranged in an end portion of memory mat MM and three word line shunt regions WS2, WS4 and WS6.

As to column selection lines CSL for transmitting column selection signals from the column decoders, a single line is brought into a selected state in memory mat MM. The single column selection line CSL selects two bit line pairs BLP to connect the same to corresponding local IO line pairs LIO in 2-megabit memory array MSA2 which is far from the chip central portion, while selecting two bit line pairs BLP to connect the same to corresponding local IO line pairs LIO in 2-megabit memory array MSA1 which is close to the chip central portion.

Namely, the single column selection line CSL causes four bit line pairs BLP to be brought to selected states, to connect the same to four global IO line pairs GIO through local IO line pairs LIO. Two memory mats MM are selected and four bit line pairs BLP are selected in each memory mat MM, whereby eight bit line pairs BLP are selected in total so that 8-bit memory cells are simultaneously accessible in total.

FIG. 22 is a diagram showing a Z portion of FIG. 21 in an enlarged scale. Referring to FIG. 22, the memory array includes a so-called alternately arranged shared sense amplifier structure. More specifically, a local IO line pair LIO2 and a sense amplifier series SAC2 shared by memory arrays MK1 and MK2 are provided in a region between memory arrays MK1 and MK2. Sense amplifiers SA in sense amplifier series SAC2 are provided corresponding to bit line pairs BLP of even numbered order, for example, in memory arrays MK1 and MK2.

A local IO line pair LIO3 and a sense amplifier series SAC3 shared by memory arrays MK2 and MK3 are provided in a region between memory arrays MK2 and MK3. Sense amplifiers SA of sense amplifier series SAC2 are provided corresponding to bit line pairs BLP of odd numbered order, for example, in memory arrays MK2 and MK3.

When memory array MK2, for example, is selected, each sense amplifier SA in sense amplifier series SAC2 and SAC3 is connected to a corresponding bit line pair of memory array MK2. Sense amplifier SA corresponding to a selected column of sense amplifier series SAC2 is connected to local IO line pair LIO2, and further connected to global IO line pair GIO through block selecting switch BS. Sense amplifier SA corresponding to a selected column of sense amplifier series SAC3 is connected to local IO line pair LIO3, and further connected to global IO line pair GIO, not shown, through block selecting switch BS, not shown.

FIG. 23 illustrates a structure which is related to a single 32-K bit memory array MK2 with one part omitted. For simplification, only a portion which is related to local IO line pair LIO2 and sense amplifier series SAC2 in memory array MK2 is shown in FIG. 23. A portion which is related to local IO line pair LIO3 and sense amplifier series SAC3 is not shown.

Referring to FIG. 23, 32-K bit memory array MK2 includes word lines WL which receive row selection signals from the row decoders, bit line pairs BLP which are arranged in a direction intersecting with word lines WL, and dynamic memory cells MC which are arranged in correspondence to intersections between word lines WL and bit line pairs BLP.

Each memory cell MC includes an access transistor and a capacitor for storing information. Each bit line pair BLP includes bit lines BL and /BL which receive complementary signals. Referring to FIG. 23, memory cells MC are arranged in correspondence to intersections between bit lines BL and word lines WL.

An array selecting gate SAG1 is arranged at an end portion on the side of local IO line pair LIO2 of memory array MK1, not shown, and an array selecting gate SAG2 is arranged in an end portion on the side of local IO line pair LIO2 of memory array MK2. Array selecting gate SAG1 is rendered conductive in response to an array selection signal φA1, and array selecting gate SAG2 is rendered conductive in response to an array selection signal φA2. Bit line pairs BLP of memory arrays MK1 and MK2 are connected to sense amplifiers SA of sense amplifier series SAC2 through array selecting gates SAG1 and SAG2, respectively. Sense amplifiers SA are activated in response to a sense amplifier activation signal S0N.

A bit line equalize circuit EQB2 is provided to each sense amplifier SA for applying a precharge potential Vcc/2 to bit lines BL, /BL connected to the sense amplifier SA. Bit line equalize circuit EQB2 is activated in response to a bit line equalize signal BLEQ in a period before activation of sense amplifiers SA in data reading operation.

A column selecting gate CSG2 is provided to each sense amplifier SA for transmitting data sensed and amplified by the sense amplifier SA to local IO line pair LIO2. A local IO line pair equalize circuit EQL2 is provided for applying a precharge potential Vcc to local IO line pair LIO. Local IO line pair equalize circuit EQL2 is activated in response to a local IO line equalize signal LIOEQ during a period before activation of write buffers WB in data writing operation. Block selecting switches BS rendered conductive in response to a block selection signal φB are provided between local IO line pair LIO2 and global IO line pair GIO.

The operation is now briefly stated. When memory array MK2 includes a selected word line WL, array selection signal φA2 enters an active state so that bit line pairs BLP included in memory array MK2 are connected to sense amplifiers SA of sense amplifier series SAC2. An array selecting gate SAG1 which is provided for memory array MK1 enters a nonconductive state. Memory array MK1 maintains a precharged state.

In memory array MK2, memory cell data appear on the respective bit line pairs BLP, and thereafter sense amplifiers are activated to detect and amplify the memory cell data.

Then, the signal on column selection line CSL rises to a logical high or H level to enter an active state, whereby column selecting gate CSG2 conducts so that the data which are detected and amplified by sense amplifiers SA are transmitted to local IO line pair LIO2.

Subsequently or simultaneously, block selection signal φB enters the H level in an active state, so that local IO line pair LIO2 is connected to global IO line pair GIO. In data reading, data of the global IO line pair are amplified through preamplifiers PA, to be stored in the read register and thereafter successively outputted. In data writing, on the other hand, write data which are supplied from write buffers WB are transmitted to the selected bit line pairs BLP through global IO line pairs GIO and local IO line pairs LIO, so that the data are written in the memory cells.

Block selection signals φB enter active states only for memory array MK2 including the selected word line WL. This also applies to array selection signals φA1 and φA2. Block selection signal φB and array selection signals φA1 and φA2 can be generated through a prescribed number of bits (four bits, for example) of row address signals.

FIG. 24 is a timing chart showing states of external signals when data of eight bits are read out continuously in such an SDRAM. The number of bits of data read out or written continuously is called burst length, which can be changed by a mode register in the SDRAM.

In the SDRAM, at the rising edge of external clock signal CLK which is a system clock, for example, an external control signal, external address signal Add, and the like are strobed. Address signal Add includes a row address signal X and a column address signal Y multiplexed in a time sharing manner.

At the rising edge of clock signal CLK in a cycle 1, if external row address strobe signal ext./RAS is at the L level in an active state, and external column address strobe signal ext./CAS and external write enable signal ext./WE are at the H level, address signal Add at that time is strobed as a row address signal Xa.

Then, at the rising edge of clock signal CLK in a cycle 4, if external column address strobe signal ext./CAS is at the L level in an active state, address signal Add at that time is strobed as a column address signal Yb. According to the strobed row address signal Xa and column address signal Yb, row and column selecting operations are carried out in the SDRAM. After a predetermined clock period (six clock cycles in FIG. 24) since external row address strobe signal ext./RAS fell to the L level, the first data b0 is outputted. In response to the falling of clock signal CLK, data b1 to b7 are outputted thereafter.

FIG. 25 is a timing chart showing states of external signals when data of eight bits are continuously written in the SDRAM.

In the writing operation, row address signal Xa is strobed similarly to the case of the data reading operation. More specifically, at the rising edge of clock signal CLK in the cycle 1, if signal ext./RAS is at the L level in an active state, and signals ext./CAS and ext./WE are at the H level, address signal Add at that time is strobed as row address signal Xa. At the rising edge of clock signal CLK in a cycle 3, if signals ext./CAS and ext./WE are both at the L level in an active state, column address signal Yb is strobed, and data b0 applied at that time is strobed as the first write data. In response to the rising edges of signals ext./RAS and ext./CAS, row and column selecting operations are carried out in the SDRAM. In synchronization with clock signals CLK, input data B1 to B7 are successively strobed. The input data are written in memory cells successively.

FIG. 26 is a circuit block diagram showing a specific structure of equalize circuit EQG and write buffer WB which are activated at the time of writing operation of the SDRAM. In FIG. 26, equalize circuit EQG and write buffer WB of bank #1 are shown.

Referring to FIG. 26, equalize circuit EQG includes N channel MOS transistors Tr1, Tr2 and Tr3. MOS transistor Tr1 has its source connected to global IO line GIOL, and receives power supply potential Vcc at its drain. MOS transistor Tr2 has its source connected to global IO line /GIOL, and receives power supply potential Vcc at its drain. MOS transistor Tr3 is connected between global IO lines GIOL and /GIOL. MOS transistors Tr1, Tr2 and Tr3 receive equalize circuit activation signal φEQ1 at their gates.

Write buffer WB includes N channel MOS transistors Tr4, Tr5 and Tr6. MOS transistor Tr4 has its drain connected to global IO line GIOL, its source connected to a node N1, and its gate connected to one output node WRa of write transistor 59a. MOS transistor Tr5 has its drain connected to global IO line /GIOL, its source connected to node N1, and its gate connected to the other output node WRb of write transistor 59a. MOS transistor Tr6 has its drain connected to node N1, and its gate supplied with write buffer activation signal φWB1.

FIG. 27 is a timing chart showing continuous writing operation (burst length=4) of the circuit shown in FIG. 26. Referring to FIGS. 26 and 27, operation of the circuit of FIG. 26 will be described. Signal φEQ1 is brought to the H level in an active state in advance only for a prescribed time, so that MOS transistors Tr1, Tr2, and Tr3 of equalize circuit EQG are rendered conductive, and that global IO lines GIOL and /GIOL are charged to a prescribed potential Vcc-Vth (wherein Vth is a threshold voltage of an MOS transistor).

Signal /CAS attains the L level in an active state, and a continuous write command is given. In response to this, signal φWB1 attains the H level in an active state. As a result, MOS transistor Tr6 of write buffer WB is rendered conductive. When write register 59a is activated in response to signal φRw1, and outputs the H level to one of two output nodes WRa and WRb in response to an externally applied data signal, MOS transistor Tr4 or Tr5 of write buffer WB is rendered conductive, causing global IO line GIOL or /GIOL to be grounded. The potential of global IO line pair GIO is written in memory cell MC of a desired address through the selected local IO line pair LIO and bit line pair BL.

Then, signal φEQ1 attains the H level in an active state, and global IO line pair GIO is equalized. The writing operation and the equalizing operation are carried out in one clock cycle. Note that a write time of the first bit is shorter than those of the second bit and et seq., since an external address signal must be decoded to an internal address signal before writing of the first bit. This also applies to equalize circuit EQG and write buffer WB of bank #2.

FIG. 28 is a timing chart showing change of external signals and the potential of global IO line pair GIO at the time of random writing operation. In the random writing operation, address signal Add, a data signal, or the like are independently strobed whenever signal /CAS attains the L level, and data is written in memory cell MC at an address corresponding to each address signal Add. Also at the time of random writing operation, the writing operation and the equalizing operation are carried out in one clock cycle, similarly to the case of the continuous writing operation.

As described above, the SDRAM strobes external control signals ext./RAS, ext./CAS, address signal Add, a data signal, and the like at the rising edge of clock signal CLK for operation. Therefore, the SDRAM does not need to secure a data input/output margin taking a skew of an address or the like (offset of timing) into consideration, and the SDRAM can advantageously shorten a cycle time as compared to a conventional DRAM, which strobes an address or data in synchronization with external control signals ext./RAS and ext./CAS for operation. Further, in some systems in which several continuous bits are accessed at a high frequency, the average access time can be comparable to that of a static random access memory (SRAM) by increasing the speed of the continuous access operation.

FIG. 29 is a diagram functionally showing a structure of a main part of a conventional SDRAM of 2-bit prefetch. This figure is compared to FIG. 19. Since banks #1 and #2 have the same structure also in this SDRAM, only a part which is related to bank #1 will be described. For simplification of illustration, control signal generating circuit 62 and the like shown in FIG. 19 are omitted.

Referring to FIG. 29, in the SDRAM, a memory array 71a including global IO line pairs GIO and GIO' in two systems is provided in each functional block 400. Preamplifier group 55a and read register 56a are provided corresponding to one global IO line pair GIO, and a preamplifier group 55a' and read register 56a' are provided corresponding to the other global IO line pair GIO'. A selector 68a is provided for alternately applying each of outputs of two read registers 56a and 56a' to output buffer 57a. Selector 68a is controlled by a selector control signal φSEr1 outputted from control signal generating circuit 63.

In addition, write register 59a and write buffer group 60a are provided corresponding to one global IO line pair GIO, and a write register 59a' and a write buffer group 60a' are provided corresponding to the other global IO line pair GIO'. A selector 69a is provided for applying the output of input buffer 58a to one of two write registers 59a and 59a' alternately. Selector 69a is controlled by a selector control signal φSEw1 outputted from control signal generating circuit 63. An equalize circuit group 61a is provided in common to global IO line pairs GIO and GIO' in two systems.

FIG. 30 specifically shows arrangement of IO lines of the SDRAM shown in FIG. 29. This figure is compared to FIG. 21. In this SDRAM, two global IO line pairs GIO and GIO' are arranged along the longer side of memory mat MM, and two global IO line pairs GIO and GIO' are arranged in three word line shunt regions WS2, WS4 and WS6, respectively.

Two local IO line pairs LIO and LIO' are provided for connecting two global IO line pairs GIO and GIO' and selected 256-K bit memory array MA. Four local IO line pairs in total including two local IO line pairs LIO and LIO' arranged on one side and two local IO line pairs LIO and LIO' arranged on the other side are arranged for a single 256-K bit memory array MA. Two local IO line pairs LIO and LIO' are shared by two 256-K bit memory arrays MA adjacent to each other.

Block selecting switches BS are arranged for connecting global IO line pairs GIO and local IO line pairs LIO. Block selecting switches BS' are provided for connecting global IO line pairs GIO' and local IO line pairs LIO'. Two block selecting switches BS and BS' are arranged in an end portion of memory mat MM and three word line shunt regions WS2, WS4 and WS6.

FIG. 31 is a circuit block diagram showing a structure of a part which is related to one 32-K bit memory array MK with one part omitted. This figure is compared to FIG. 23. Referring to FIG. 31, in the SDRAM, two global IO line pairs GIO and GIO', two local IO line pairs LIO2 and LIO2', and two block selecting switches BS and BS' are provided as described above. Two local IO line pair equalize circuits EQL2 and EQL2' are provided corresponding to two local IO line pairs LIO2 and LIO2'.

One column selection line CSL is arranged corresponding to two bit line pairs BLP. Two bit line pairs BLP selected by one column selection signal CSL are connected to two local IO line pairs LIO2 and LIO2' through column selecting gate CSG2.

FIG. 32 is a circuit block diagram specifically showing a structure of a part which is related to writing operation of the SDRAM shown in FIG. 29. This figure is compared to FIG. 26.

Referring to FIG. 32, in the SDRAM, write buffer WB and equalize circuit EQG are provided corresponding to global IO line pair GIO, and write buffer WB' and equalize circuit EQG' are provided corresponding to global IO line pair GIO'. Write buffers WB and WB' are activated in response to signals φWB1 and φWB1', respectively. Equalize circuits EQG and EQG' are both activated in response to signal φEQ1.

FIG. 33 is a timing chart showing continuous writing operation (burst length=4) of the circuit shown in FIG. 32. Referring to FIGS. 32 and 33, operation of the circuit of FIG. 32 will be described.

Data are divided between write registers 59a and 59a' according to a lower one bit of an address when a write command is inputted. In FIG. 33, the case where the lower address is "0" is shown. The first data is stored in write register 59a, and applied to global IO line pair GIO in response to signal φWB1 attaining the H level in an active state. Data to be applied at the next rising edge of clock signal CLK is stored in write register 59a', and applied to global IO line pair GIO' in response to signal φWB1' attaining the H level in an active state.

The data applied to global IO line pairs GIO and GIO' are written in two selected memory cells MC through corresponding local IO line pairs LIO and LIO' and two bit line pairs BLP. After writing is complete, signal φEQ1 attains the H level in an active state, and two global IO line pairs GIO and GIO' are simultaneously equalized. Global IO line pairs GIO and GIO' are equalized every two clock cycles.

The advantage of the SDRAM of pipeline operation is that random writing on a bit basis can be carried out, since global IO line pair GIO is equalized whenever one bit of data is written, for preparation for the next data writing. More specifically, writing can be stopped and data can be written at a newly inputted address at timings shown by o marks in FIG. 27.

The SDRAM of pipeline operation has, however, a disadvantage that it is difficult to make an operating frequency higher, because it is necessary to change between the H and L levels the potential of an IO line having a large stray capacitance within one clock cycle for data writing.

On the other hand, the advantage of the SDRAM of 2-bit prefetch is that it is easy to make an operating frequency higher, because data is written every two clock cycles, which is twice longer than the case of the SDRAM of pipeline operation.

The SDRAM of 2-bit prefetch has, however, a disadvantage that random writing on a bit basis cannot be carried out, because an IO line is equalized every two clock cycles. More specifically, writing can be stopped and data can be written at a newly inputted address only at timings shown by o marks in FIG. 33. Therefore, the SDRAM of 2-bit prefetch cannot be used as a memory (for example, memory for image processing) which requires random writing operation on a 2-bit basis.

In other words, in the conventional SDRAM, random writing must be sacrificed for making the operating frequency higher. On the other hand, the high operating frequency must be sacrificed for random writing.

SUMMARY OF THE INVENTION

The principal object of the present invention is to provide a synchronous semiconductor memory device enabling high speed operation and random writing.

Briefly speaking, in a first synchronous semiconductor memory device according to the present invention, each of memory cells continuously selected by a selection circuit is alternately connected to first and second signal input/output line pairs on a clock cycle basis. Therefore, data can be written through one signal input/output line pair during one clock cycle, and the other signal input/output line pair may be equalized during the one clock cycle. As a result, data can be written easily at a high frequency, as compared to a conventional case in which data is written through one signal input/output line pair during one clock cycle, and the signal input/output line pair is equalized. Further, random writing can be carried out.

A data input/output circuit includes a data writing circuit and an equalize circuit. While the data writing circuit writes data through one signal input/output line pair, the equalize circuit equalizes the other signal input/output line pair. As a result, the data input/output circuit is easily structured.

The data input/output circuit includes first and second data writing circuits and an equalize circuit. While the first data writing circuit writes data through the first signal input/output line pair, the equalize circuit equalizes the second signal input/output line pair. While the second data writing circuit writes data through the second signal input/output line pair, the equalize circuit equalizes the first signal input/output line pair. As a result, the data input/output circuit is easily structured.

In brief, in a second synchronous semiconductor memory device according to the present invention, each of memory cell pairs continuously selected by a selection circuit is connected to first and second signal input/output line pairs. Data of two bits are written at a time in a memory cell pair in the first two clock cycles in which a write time is shortened due to generation of an internal address signal, and then data of one bit is written alternately in one and the other memory cells in a memory cell pair on a clock cycle basis. Therefore, data can be easily written at a high frequency, enabling random writing after completion of the second clock cycle.

A data input/output circuit includes first and second data writing circuits and an equalize circuit. In the first two clock cycles, the first and second data writing circuits write data of two bits through the first and second signal input/output line pairs, and after that, the equalize circuit equalizes the first and second signal input/output line pairs. In each one clock cycle thereafter, the first or second data writing circuit writes data of one bit through the first or second signal input/output line pair, and after that, the equalize circuit equalizes the first and second signal input/output line pairs. As a result, the data input/output circuit is easily structured.

In brief, in a third synchronous semiconductor memory device according to the present invention, each of memory cells continuously selected by a selection circuit is connected alternately on a clock cycle basis to one ends of first and second local signal input/output line pairs of a memory array block to which each memory cell belongs. At the same time, the other ends of the first and second local signal input/output line pairs of the memory array block to which each memory cell belongs are connected to one ends of first and second global signal input/output line pairs. Therefore, similar to the case of the first synchronous semiconductor memory device, data can be written at a high frequency more easily than the conventional case, and random writing can be carried out.

In brief, in a fourth synchronous semiconductor memory device according to the present invention, each of memory cells continuously selected by a selection circuit is connected to one end of a local signal input/output line pair of a memory array block to which each memory cell belongs. At the same time, the other end of the local signal input/output line pair of the memory array block to which each memory cell belongs is connected alternately on a clock cycle basis to one ends of first and second global signal input/output line pairs. Therefore, similar to the case of the first and second synchronous semiconductor memory devices, data can be written at a high frequency more easily than the conventional case, and random writing can be carried out. Further, a layout area is made smaller than that of the second synchronous semiconductor memory device, since the local signal input/output line pair is not divided into two systems.

In the third and fourth synchronous semiconductor memory devices, a data input/output circuit includes a data writing circuit and an equalize circuit. While the data writing circuit writes data through one global signal input/output line pair, the equalize circuit equalizes the other global signal input/output line pair. As a result, the data input/output circuit is structured easily.

Further, in the third and fourth synchronous semiconductor memory devices, the data input/output circuit includes first and second data writing circuits and an equalize circuit. While the first data writing circuit writes data through the first global signal input/output line pair, the equalize circuit equalizes the second global signal input/output line pair. While the second data writing circuit writes data through the second global signal input/output line pair, the equalize circuit equalizes the first global signal input/output line pair. As a result, the input/output circuit is structured easily.

In brief, in a fifth synchronous semiconductor memory device according to the present invention, each of memory cell pairs continuously selected by a selection circuit is connected to corresponding first and second local signal input/output line pairs. The first and second local signal input/output line pairs are connected to first and second global signal input/output line pairs on a two-clock-cycle basis. Data of two bits are written at a time in a memory cell pair in the first two clock cycles in which a write time is shortened due to generation of an internal address signal, and after that, data of one bit is written alternately in one and the other memory cells in a memory cell pair on a clock cycle basis. Therefore, data can be written at a high frequency easily. Further, random writing can be carried out after completion of the second clock cycle.

In the fifth synchronous semiconductor memory device, a data input/output circuit includes first and second data writing circuits and an equalize circuit. In the first two clock cycles, the first and second data writing circuits write data of two bits through the first and second global signal input/output line pairs, and after that, the equalize circuit equalizes the first and second global signal input/output line pairs. In each one clock cycle thereafter, the first or second data writing circuit writes data of one bit through the first or second global signal input/output line pair, and after that, the equalize circuit equalizes the first and second global signal input/output line pairs. As a result, the data input/output circuit is structured easily.

In the third to fifth synchronous semiconductor memory devices, the first and second global signal input/output line pairs are preferably provided so as to longitudinally cross word line shunt regions of at least one of a plurality of memory array blocks. As a result, a layout area is reduced.

More preferably, the first and second global signal input/output line pairs are provided so as to cross longitudinally different word line shunt regions, respectively. As a result, the layout area can be further reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
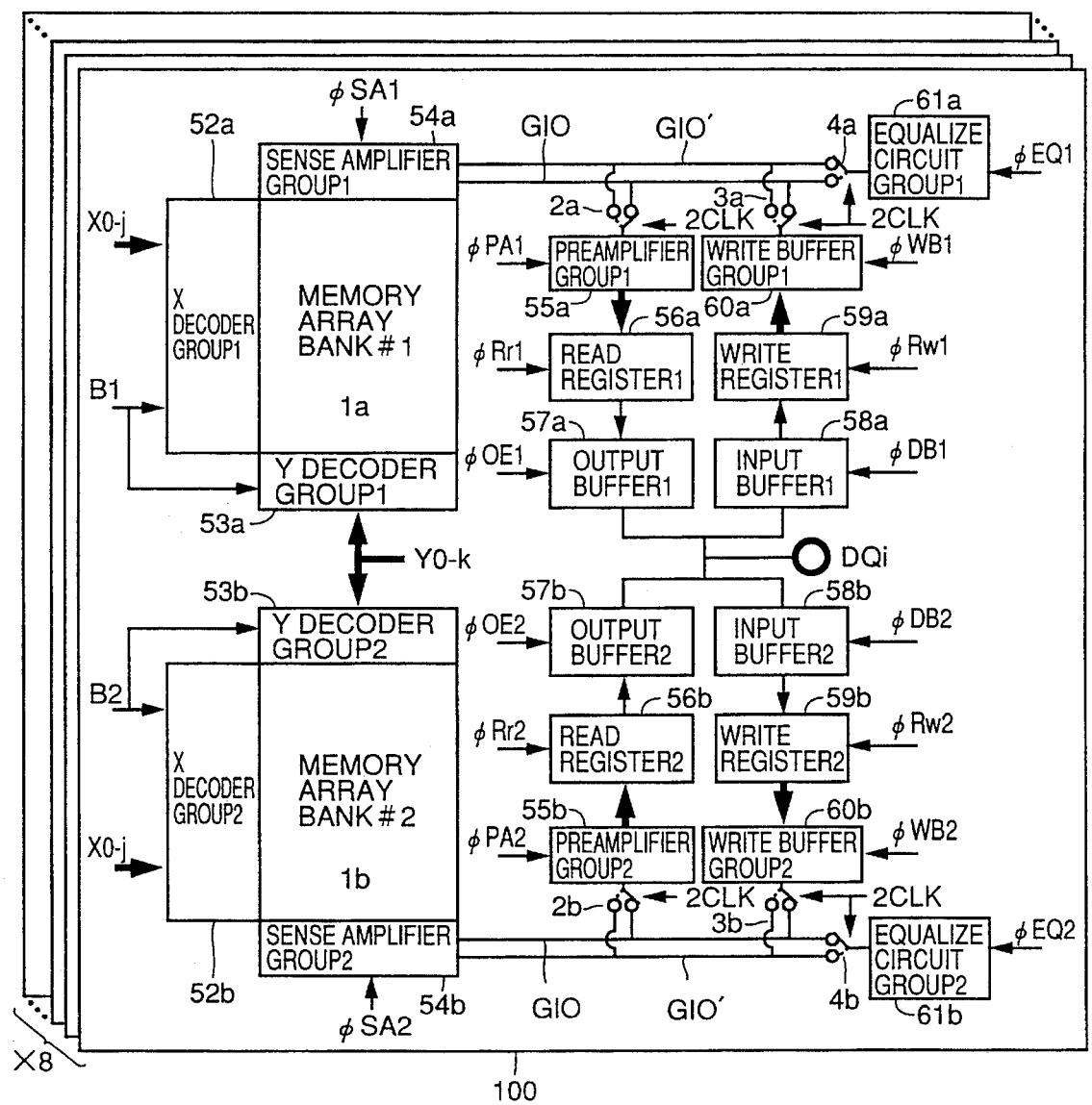
FIG. 1 is a block diagram functionally showing the entire structure of an SDRAM according to a first embodiment of the present invention.
Figure 1:
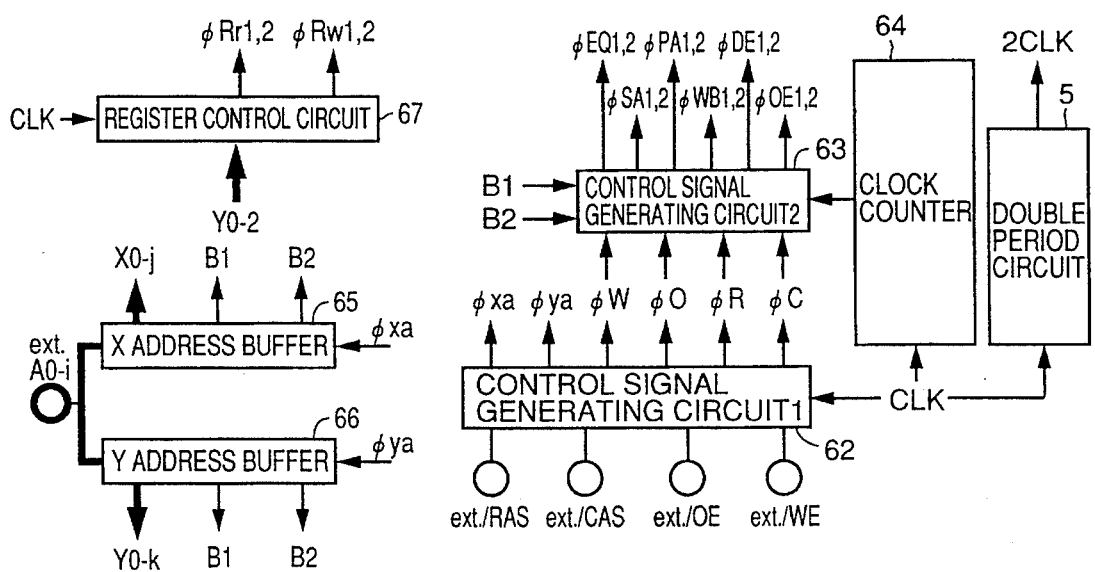

FIG. 1 is a block diagram functionally showing a structure of a main part of the SDRAM according to the first embodiment of the present invention. Since banks #1 and #2 have exactly the same structure also in this SDRAM, only a part which is related to bank #1 will be described.

Figure 19:
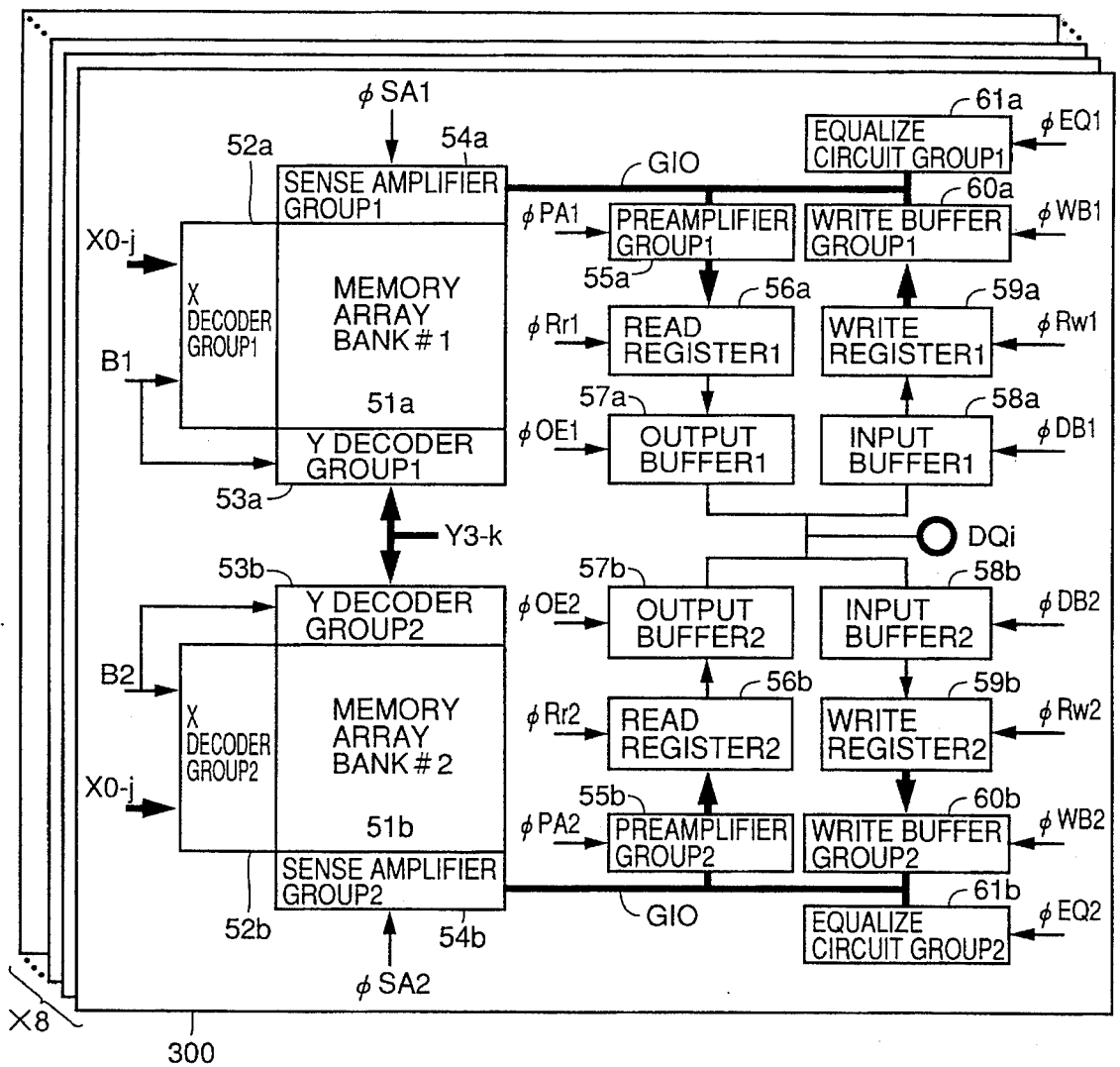
FIG. 19 is a block diagram functionally showing the entire structure of a conventional SDRAM.
Figure 19:
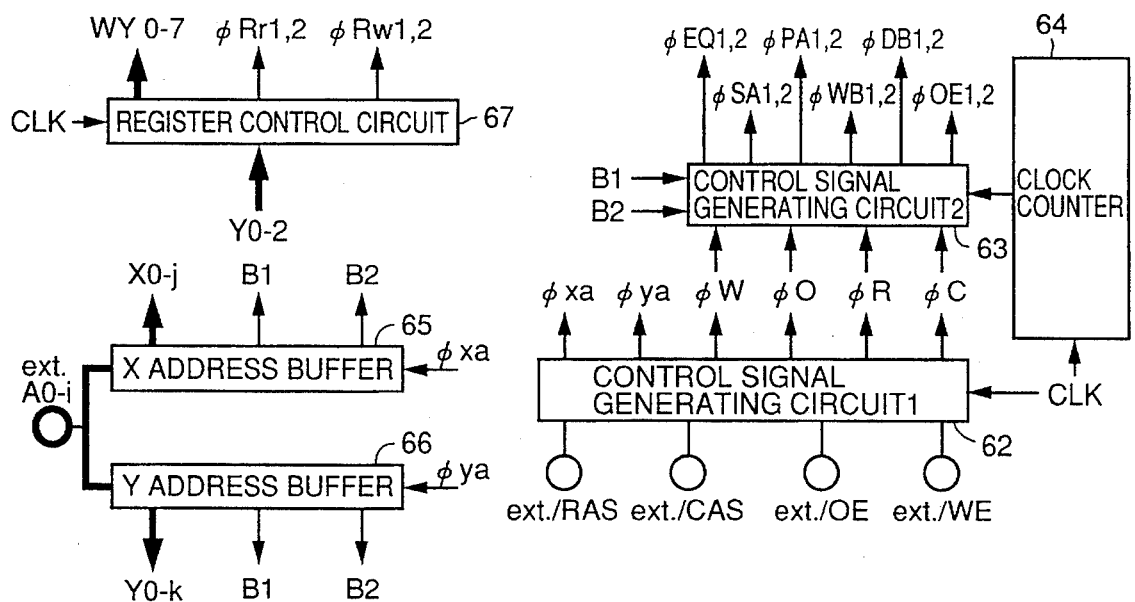
Figure 20:
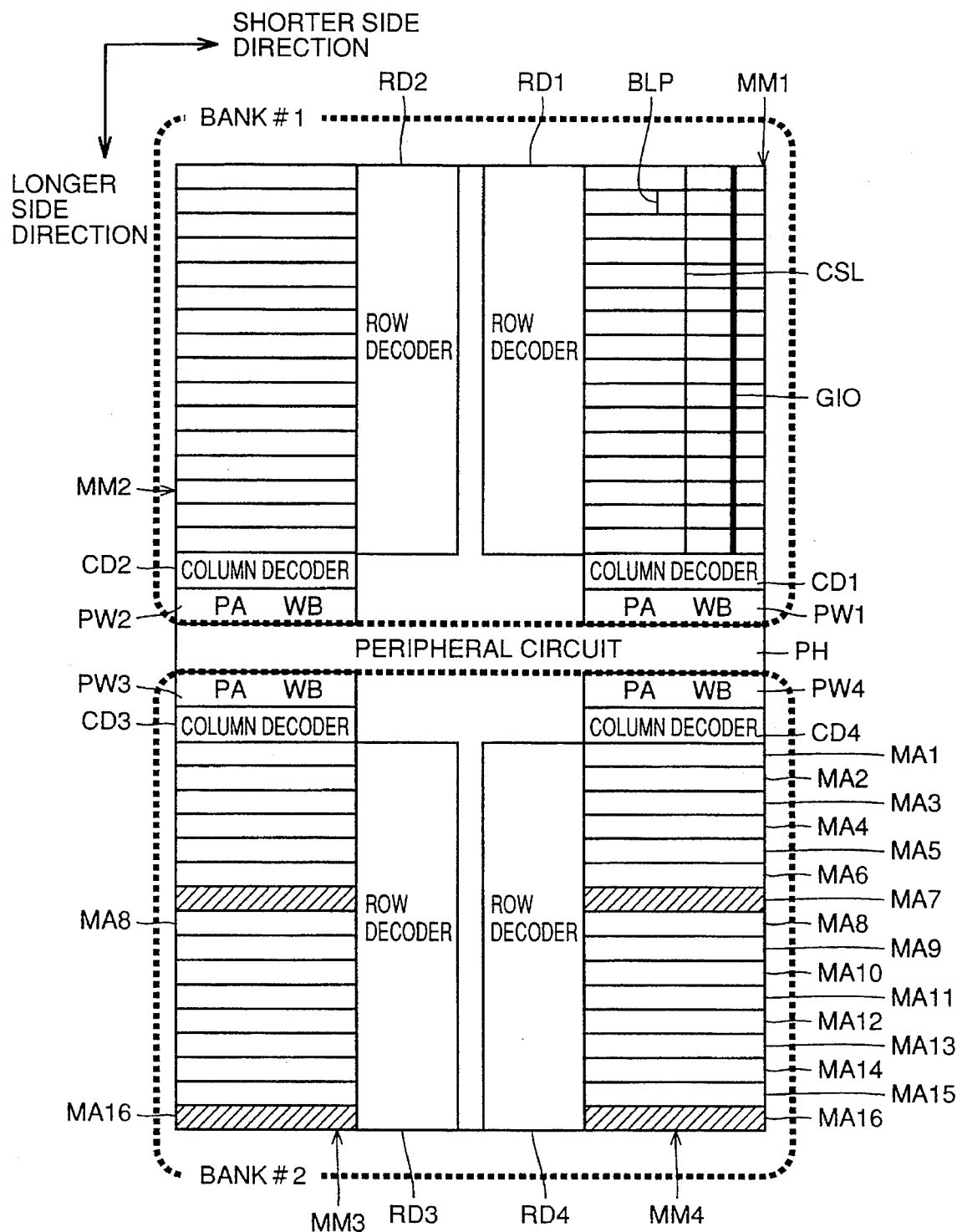
FIG. 20 illustrates a chip layout of the SDRAM shown in FIG. 19.

Referring to FIG. 1, this SDRAM is different from the SDRAM shown in FIG. 19 in that a memory array 1a including global IO line pairs GIO and GIO' in two systems is provided instead of memory array 51a in each functional block 100, and in that switches 2a, 3a and 4a are provided for alternately connecting global IO line pairs GIO and GIO' in two systems to preamplifier group 55a, write buffer group 60a and an equalize circuit 61a on a clock cycle basis. A double period circuit 5 outputting an internal clock signal 2CLK for controlling these switches 2a, 3a and 4a, and the like is provided in common to eight functional blocks 100.

Figure 2:
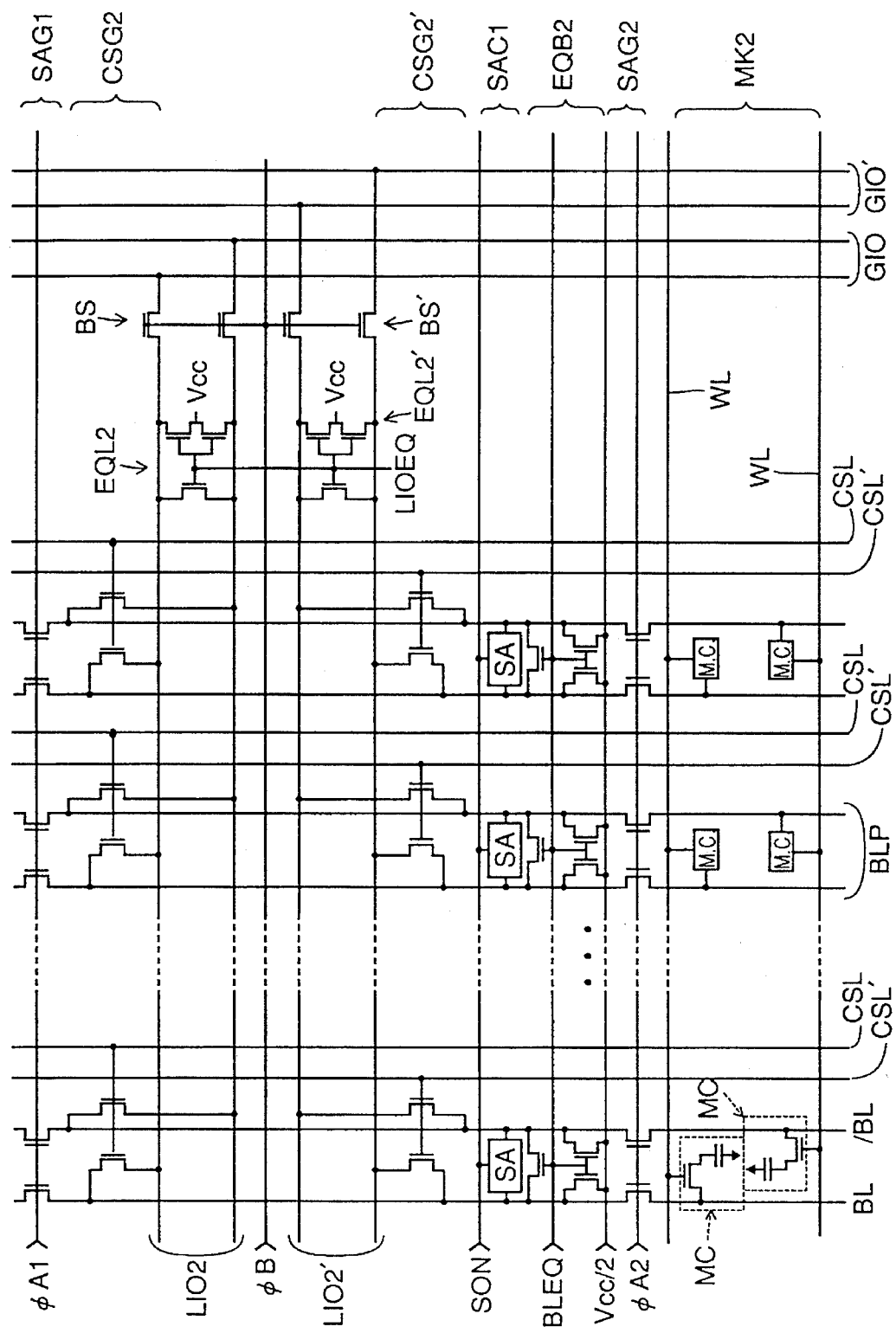
FIG. 2 is a circuit block diagram showing a structure of a part related to one 32-K bit memory array MK of the SDRAM shown in FIG. 1.
Figure 23:
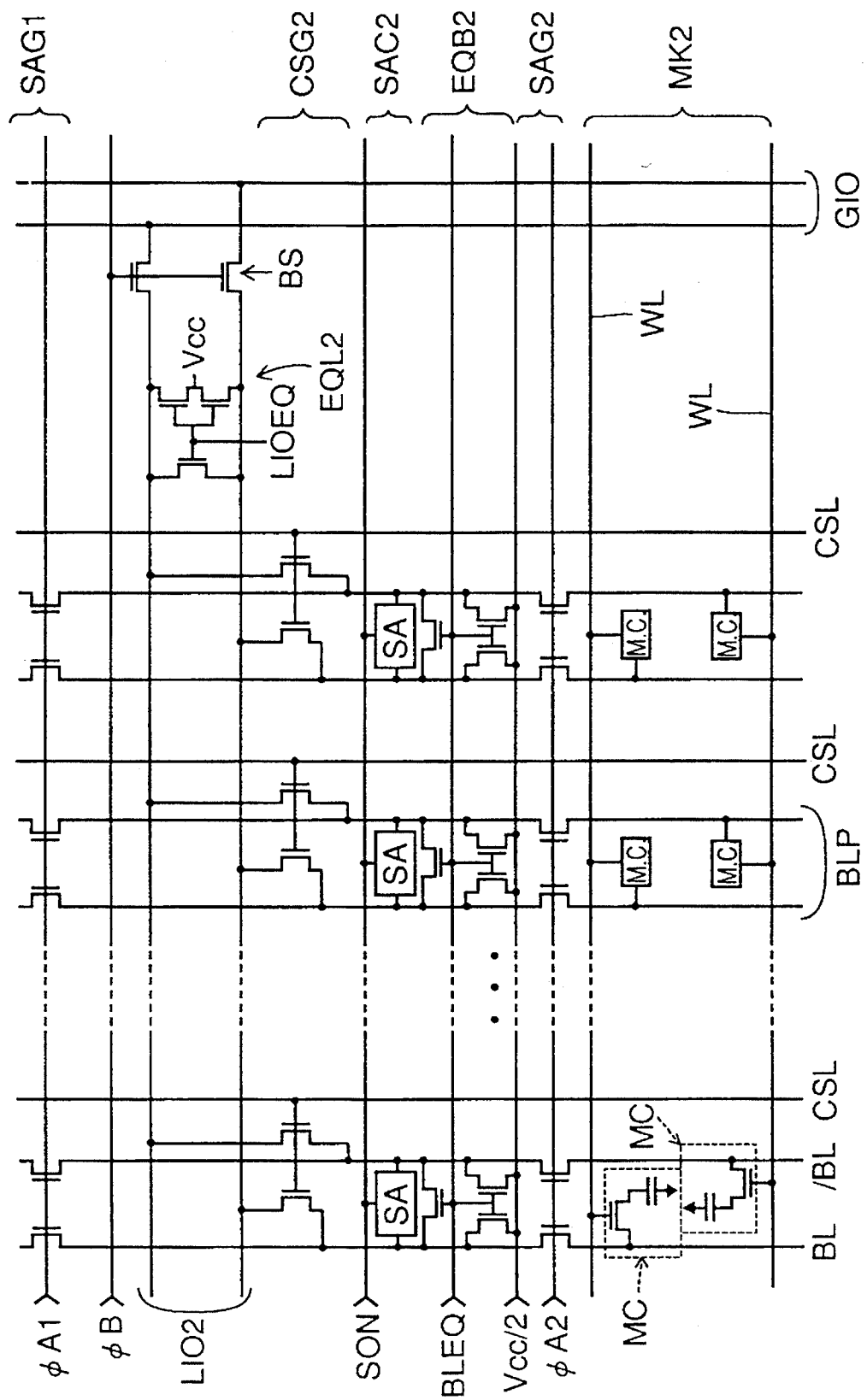
FIG. 23 is a circuit block diagram showing a structure of a part related to one local IO line pair LIO2 of the memory array shown in FIG. 22.
Figure 24:
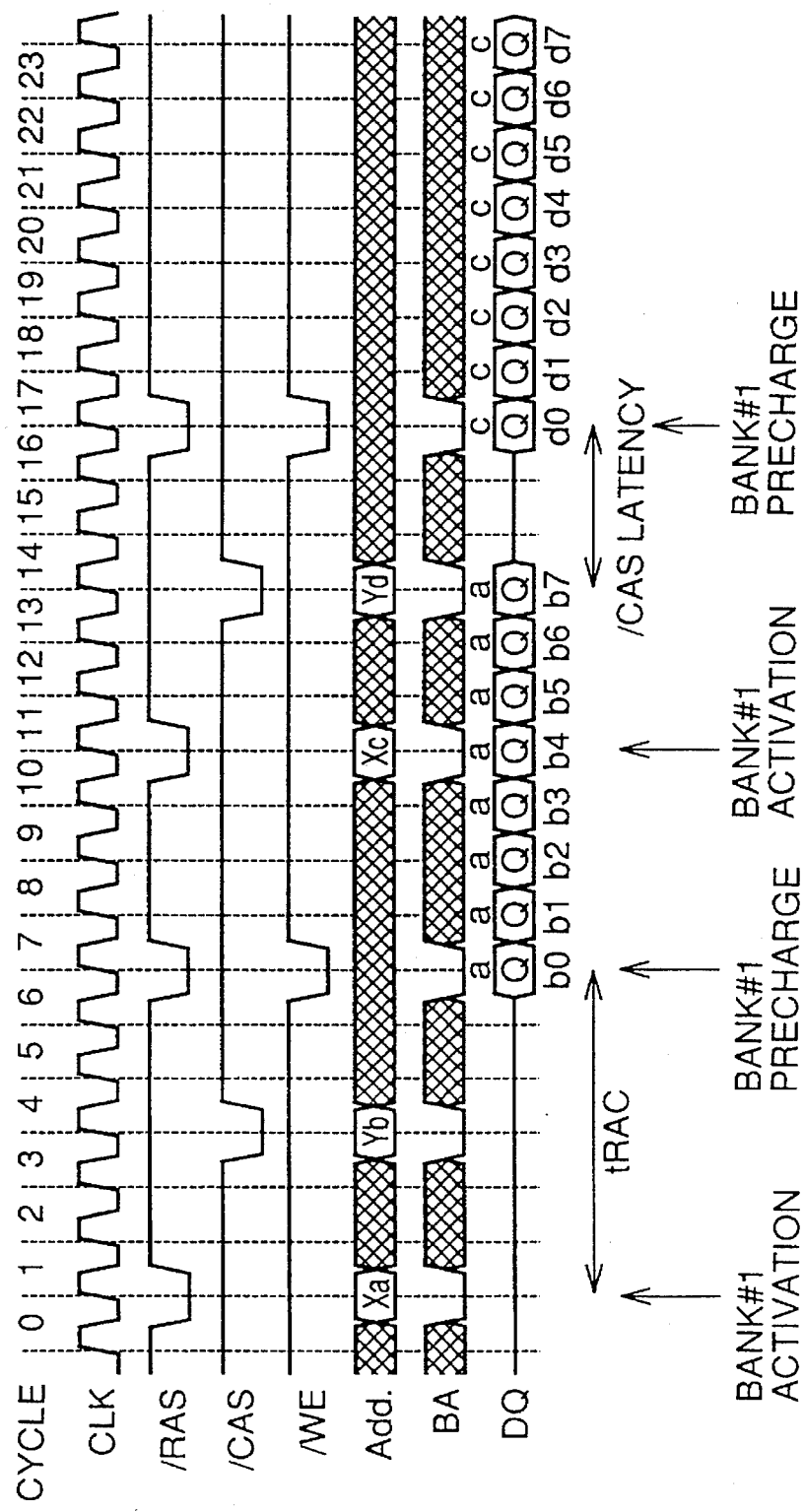
FIG. 24 is a timing chart showing states of change of external signals in continuous reading operation of the SDRAM shown in FIG. 19.
Figure 25:
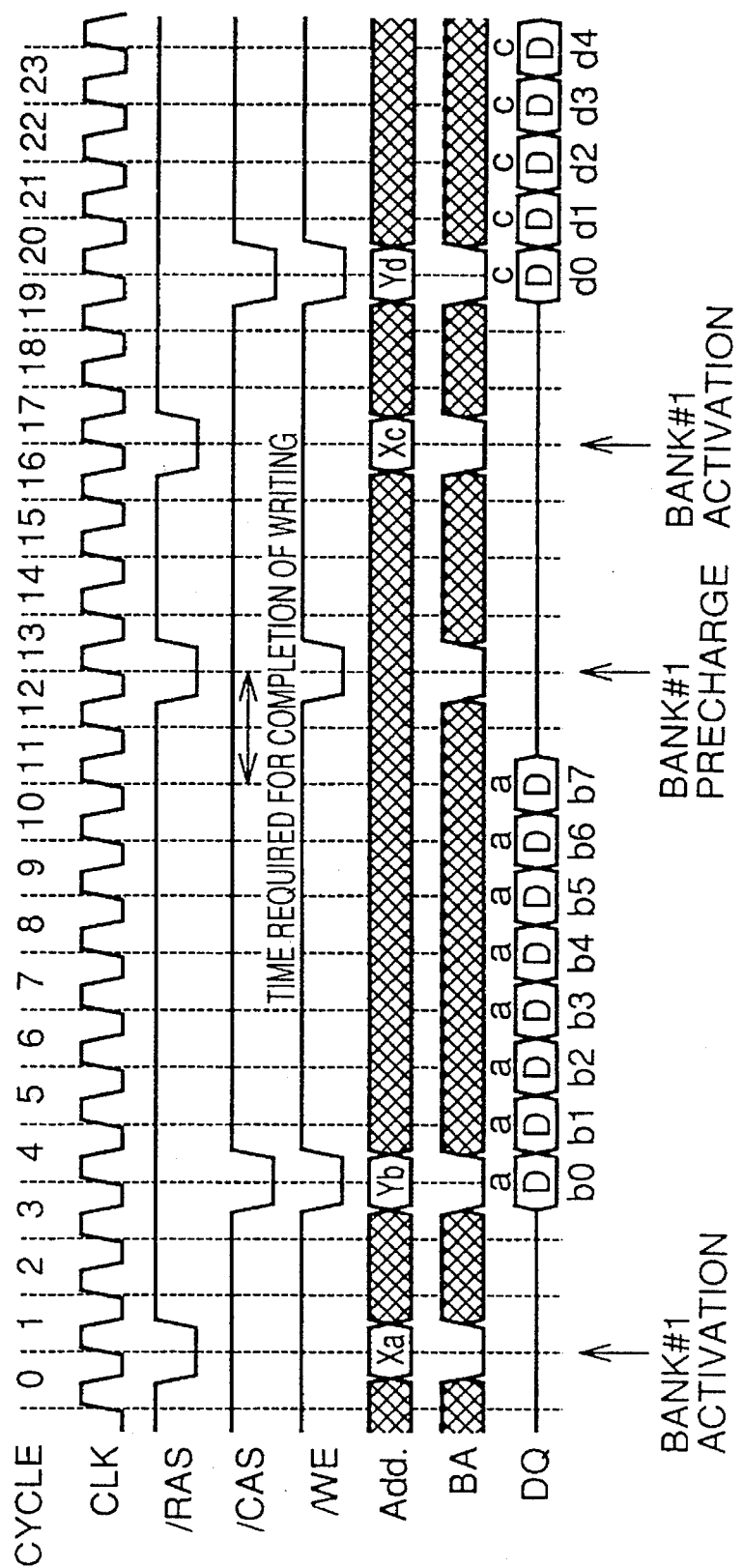
FIG. 25 is a timing chart showing states of change of external signals in continuous writing operation of the SDRAM shown in FIG. 19.

FIG. 2 is a circuit block diagram showing a structure of a part related to one 32-K bit memory array MK with one part omitted. This figure is compared to FIG. 23. Referring to FIG. 2, in the SDRAM, two global IO line pairs GIO and GIO', two local IO line pairs LIO2 and LIO2', and block selecting switches BS and BS' are provided. Two IO line equalize circuits EQL2 and EQL2' are provided corresponding to two local IO line pairs LIO2 and LIO2'.

Column selecting gate CSG2 for connecting bit line pairs BLP of each column to local IO line pair LIO2, and column selecting gate CSG2' for connecting bit line pairs BLP of each column to local IO line pair LIO2' are provided. Column selection lines CSL are arranged corresponding to column selecting gate CSG2, and column selection lines CSL' are arranged corresponding to column selecting gate CSG2'.

Figure 3:
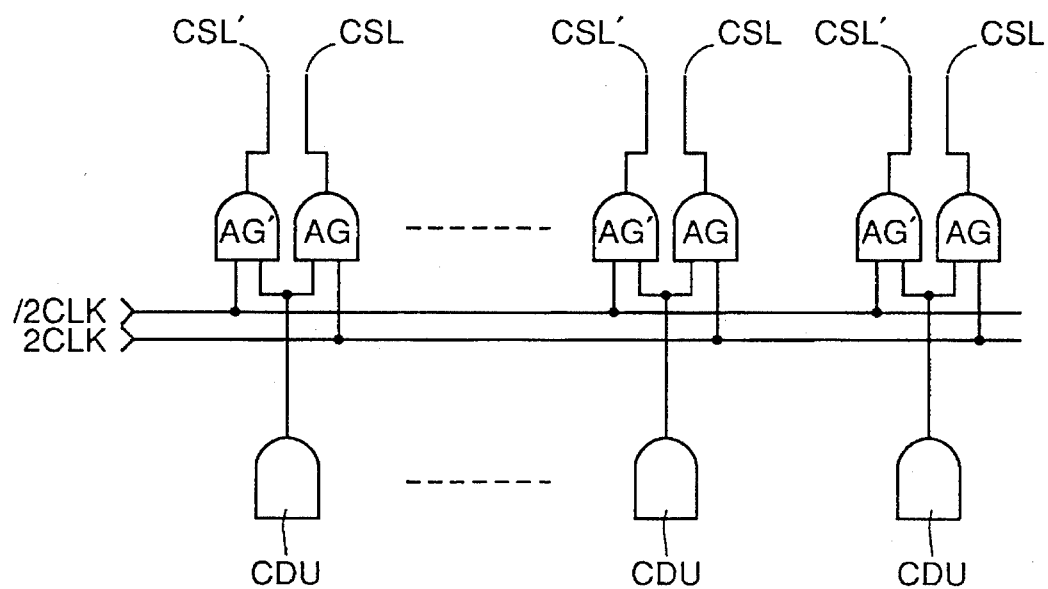
FIG. 3 is a circuit block diagram showing a structure of a circuit for selecting a column selection gate shown in FIG. 2.

FIG. 3 is a block diagram showing a circuit for selecting column selection lines CSL and CSL', which should be combined with FIG. 2. A column decoder CDU and two AND gates AG and AG' are provided corresponding to each column. AND gate AG receives the output of column decoder CDU and internal clock signal 2CLK. The output of AND gate AG is provided to column selection line CSL. AND gate AG' receives the output of column decoder CDU and an inversion signal /2CLK of the internal clock signal. The output of AND gate AG' is provided to column selection line CSL'.

The output of column decoder CDU of a selected column attains the H level only on a clock cycle basis. Therefore, only one of two column selection lines CSL and CSL' of the selected column attains the H level only on a clock cycle basis. When two columns adjacent to each other are continuously selected, for example, column selection line CSL of a column selected first attains the H level in the first one clock cycle, and column selection line CSL' of a column selected next attains the H level in the next one clock cycle.

Figure 4:
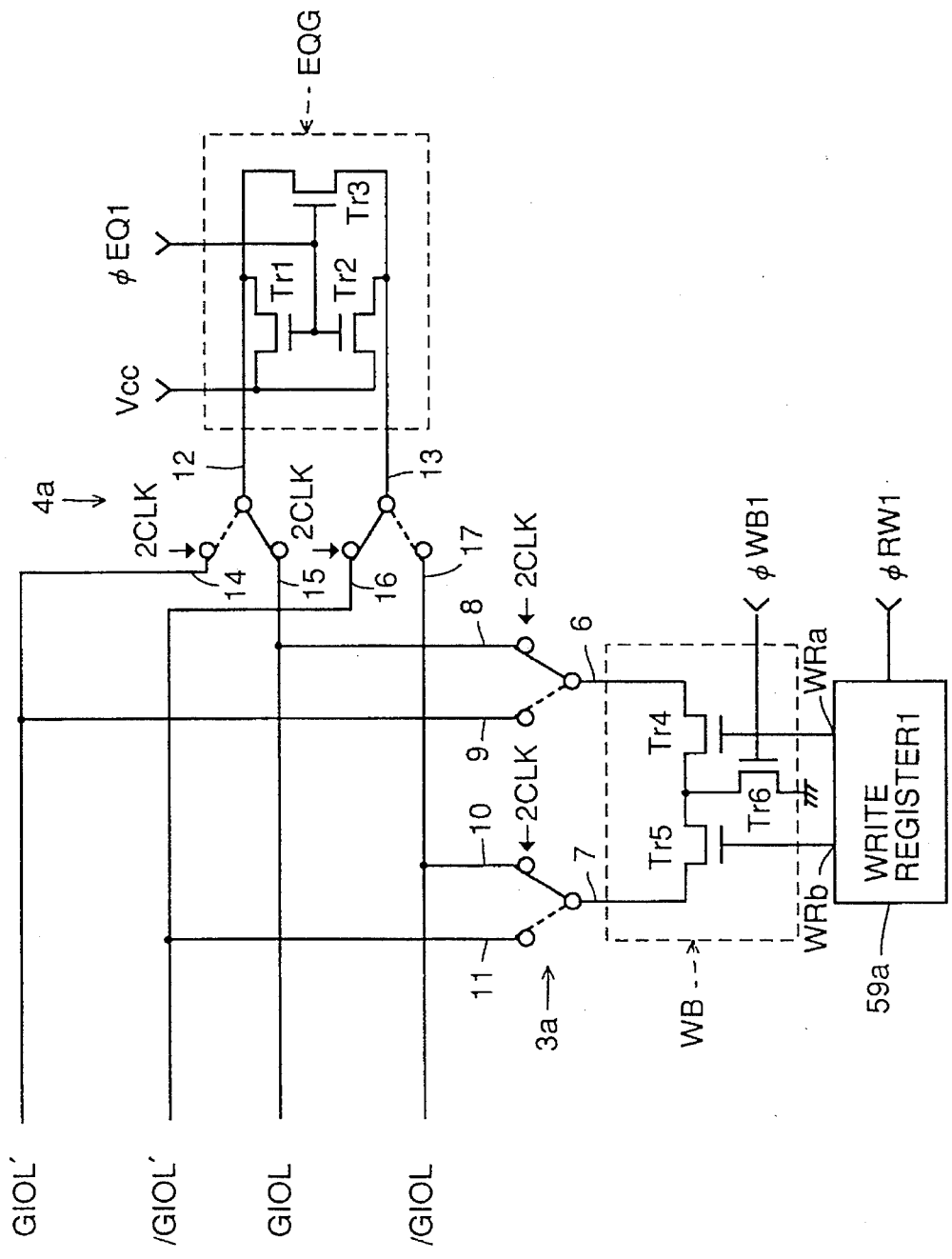
FIG. 4 is a circuit block diagram showing a structure of a part related to data writing operation of the SDRAM shown in FIG. 1.
Figure 5:
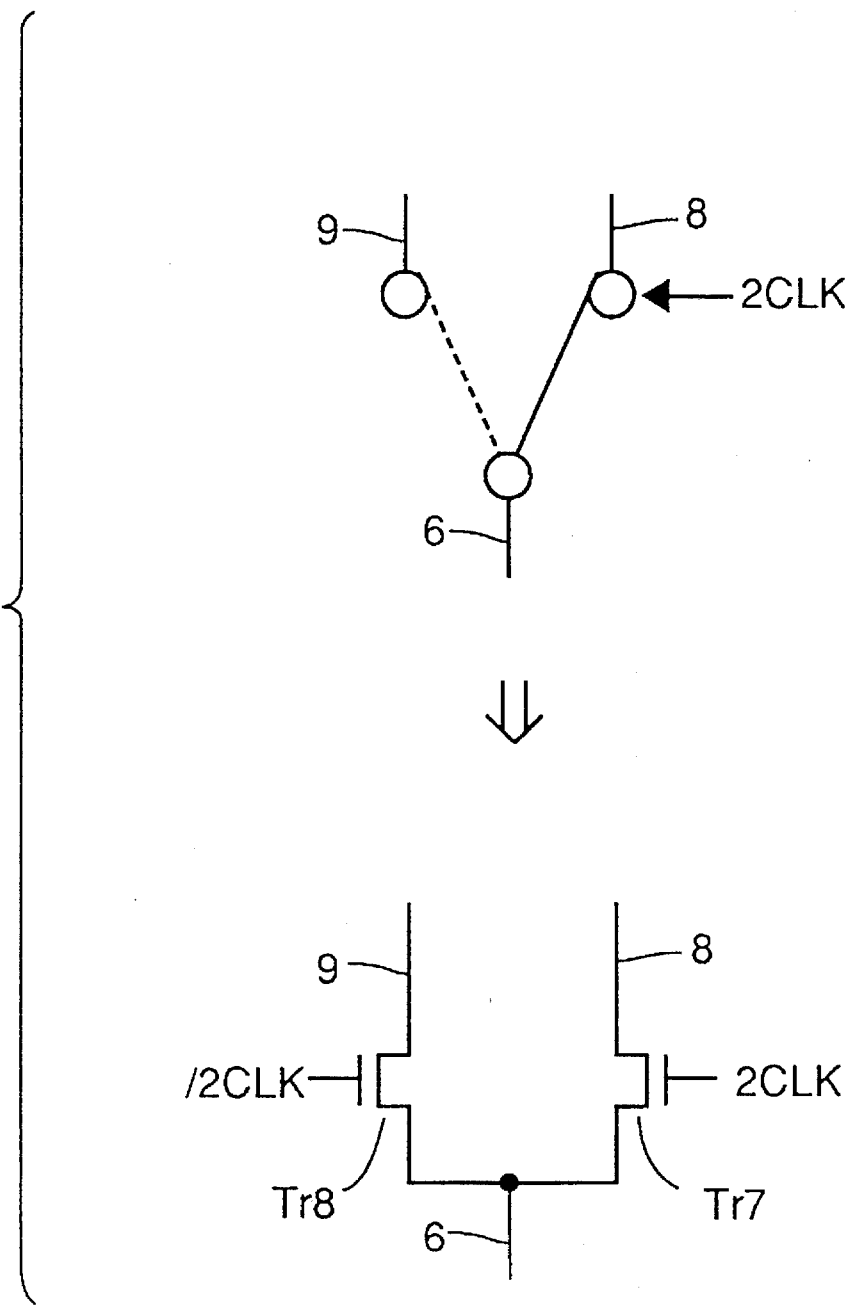
FIG. 5 is a circuit diagram illustrating a structure of a switch shown in FIG. 4.
Figure 26:
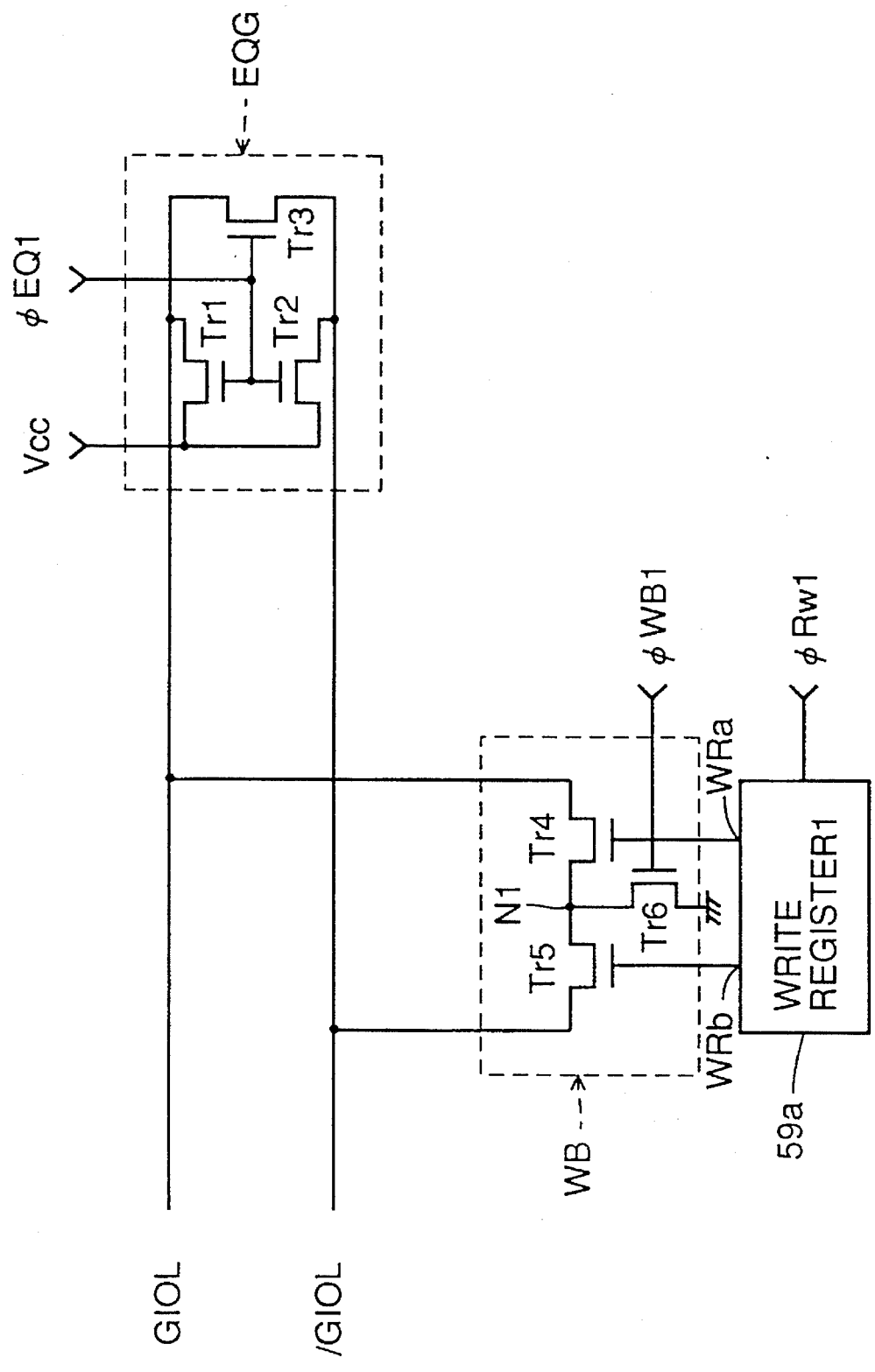
FIG. 26 is a circuit block diagram showing a structure of a part related to writing operation of the SDRAM shown in FIG. 19.
Figure 27:
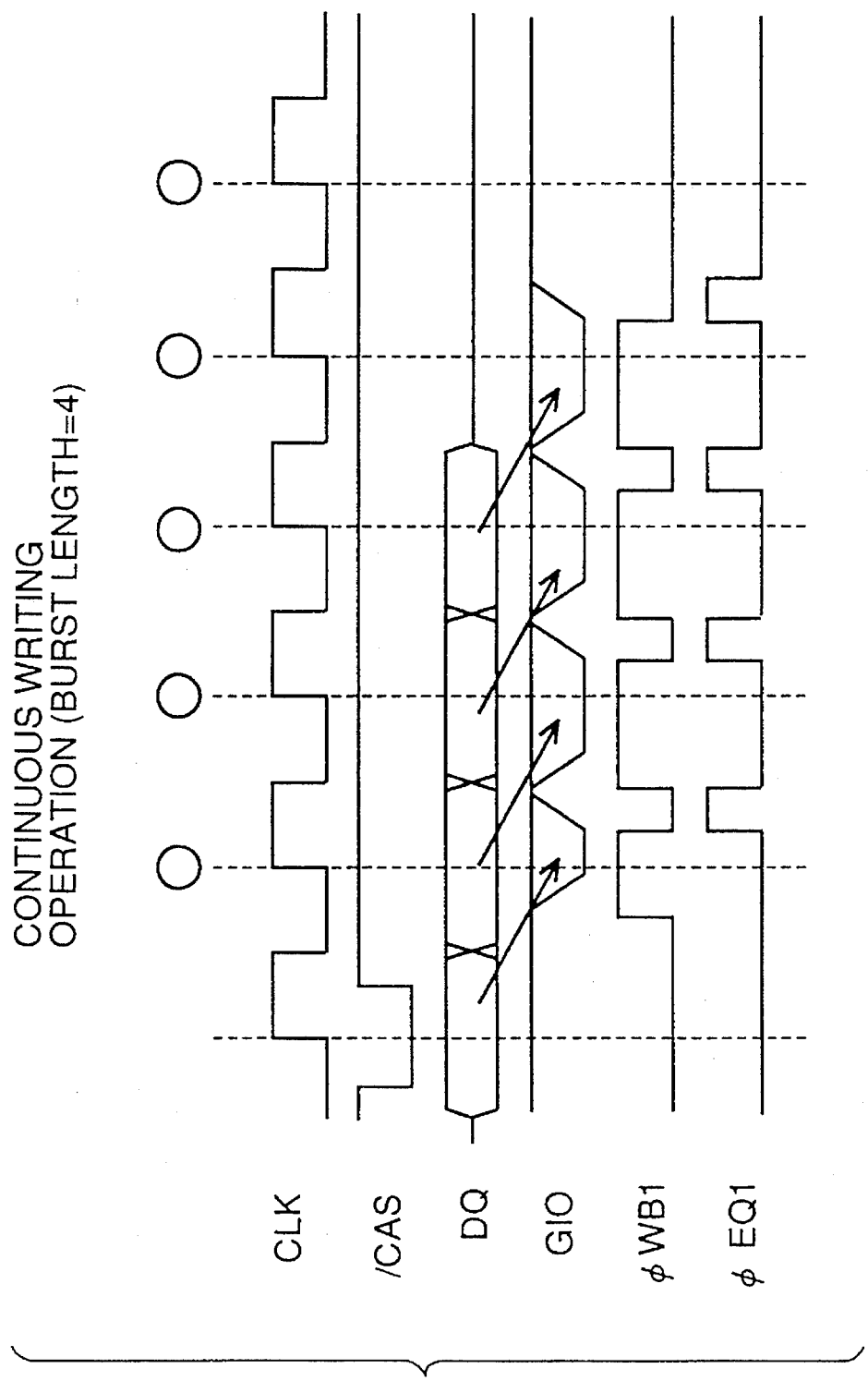
FIG. 27 is a timing chart showing change of external signals and a potential of a global IO line pair in the continuous writing operation of the SDRAM shown in FIG. 19.
Figure 28:
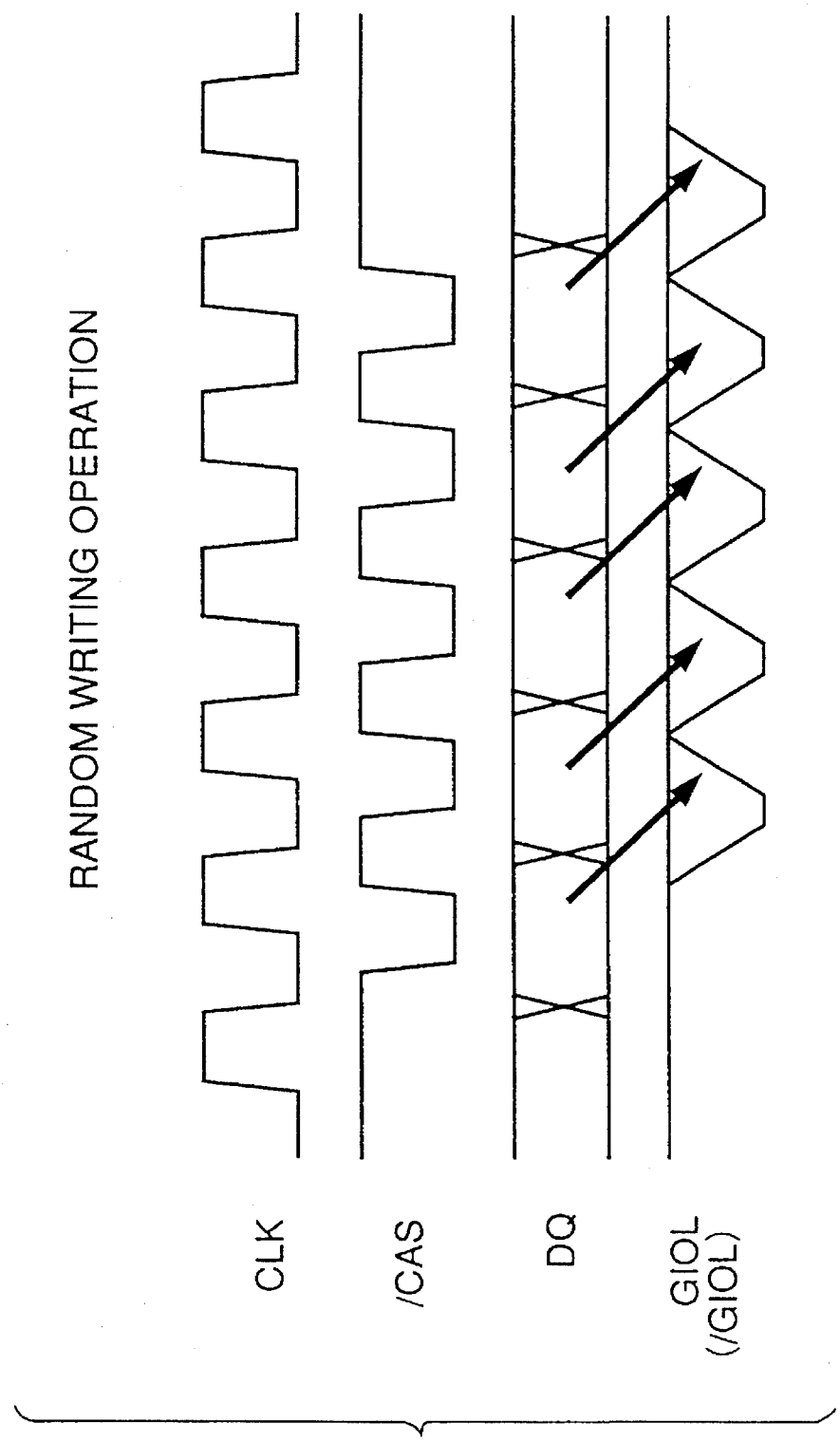
FIG. 28 is a timing chart showing change of external signals and a potential of a global IO line pair in the random writing operation of the SDRAM shown in FIG. 19.
Figure 29:
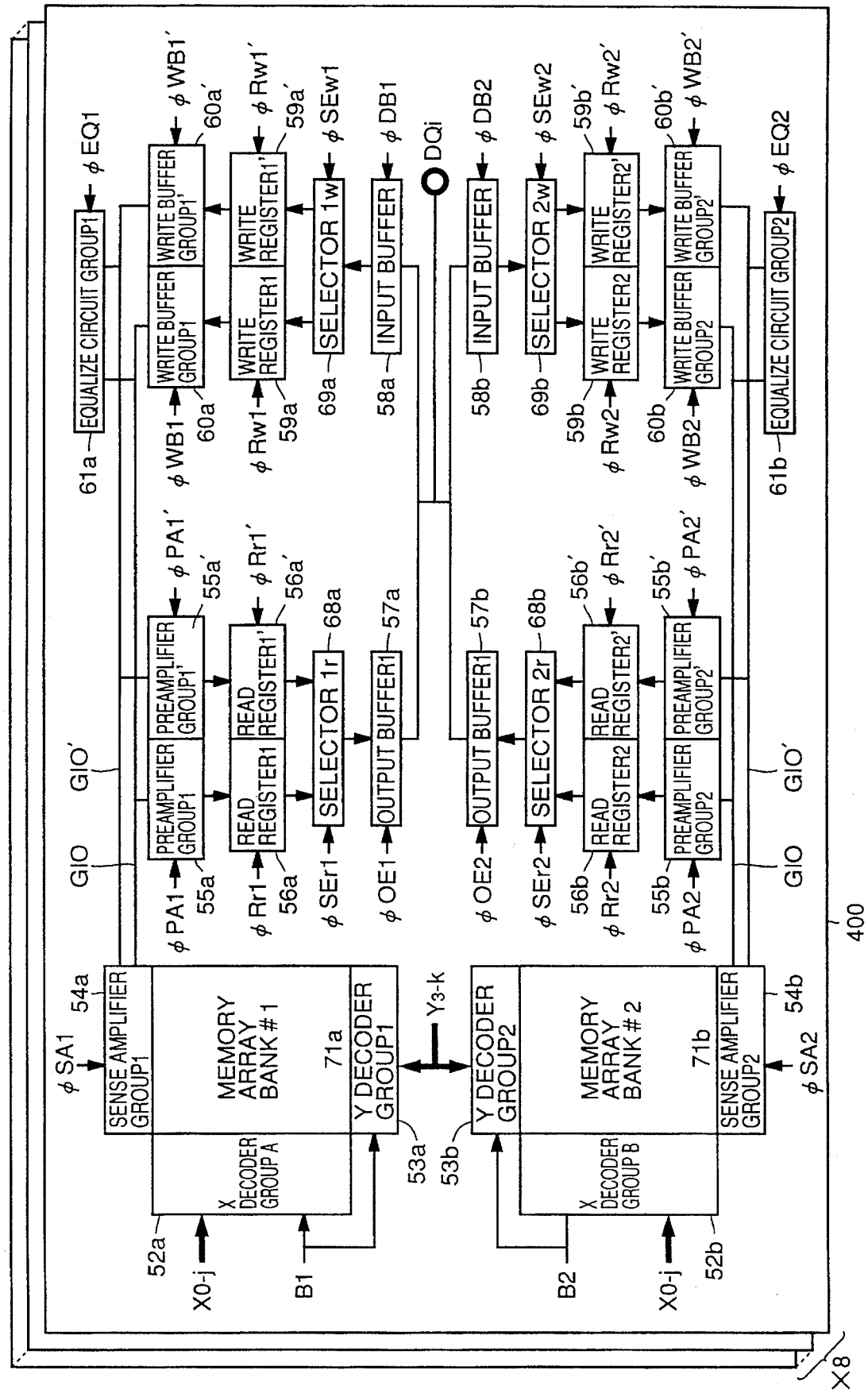
FIG. 29 is a block diagram functionally showing the entire structure of another conventional SDRAM.
Figure 30:
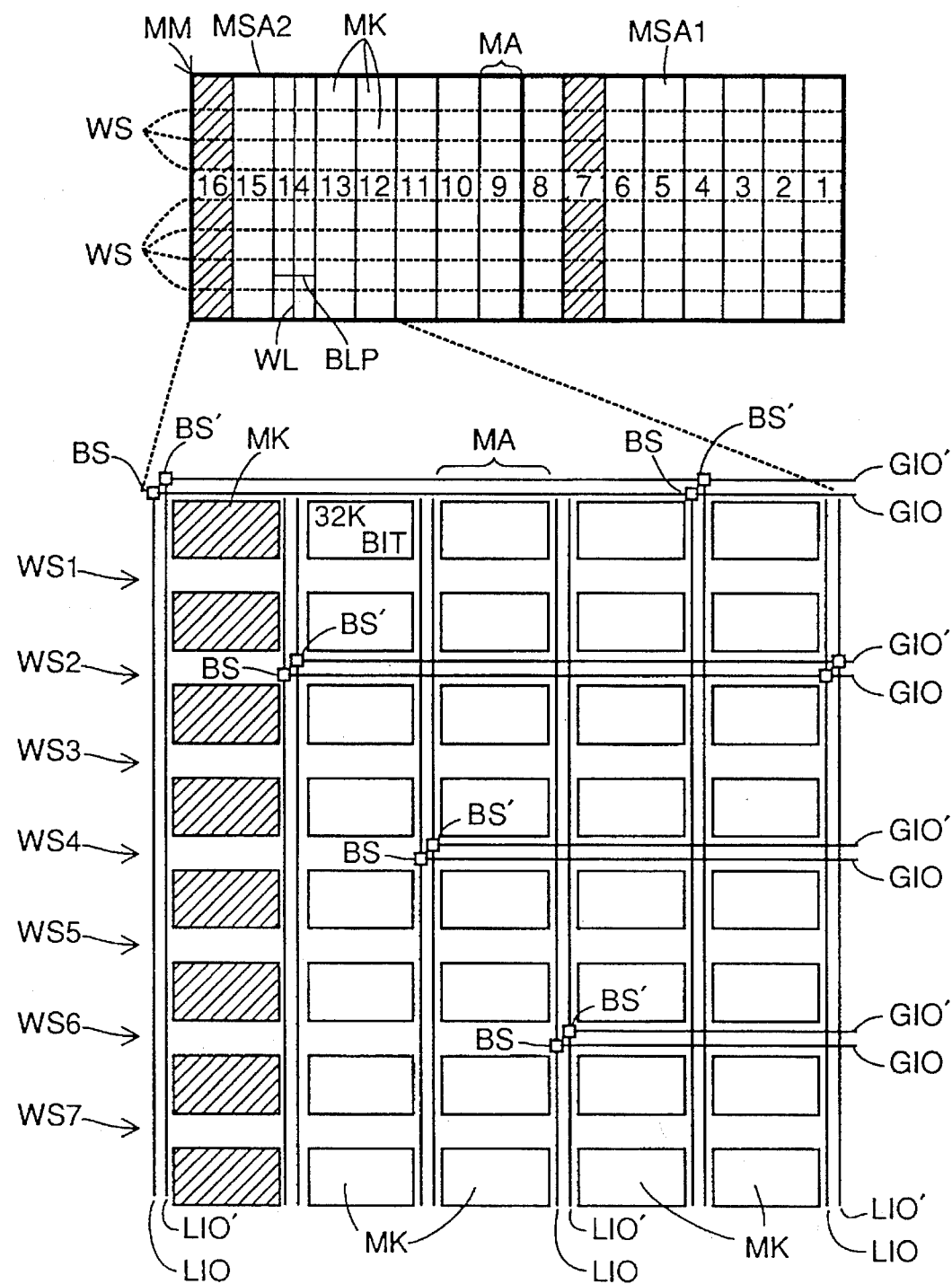
FIG. 30 specifically illustrates arrangement of IO line pairs of a memory array of the SDRAM shown in FIG. 29.
Figure 31:
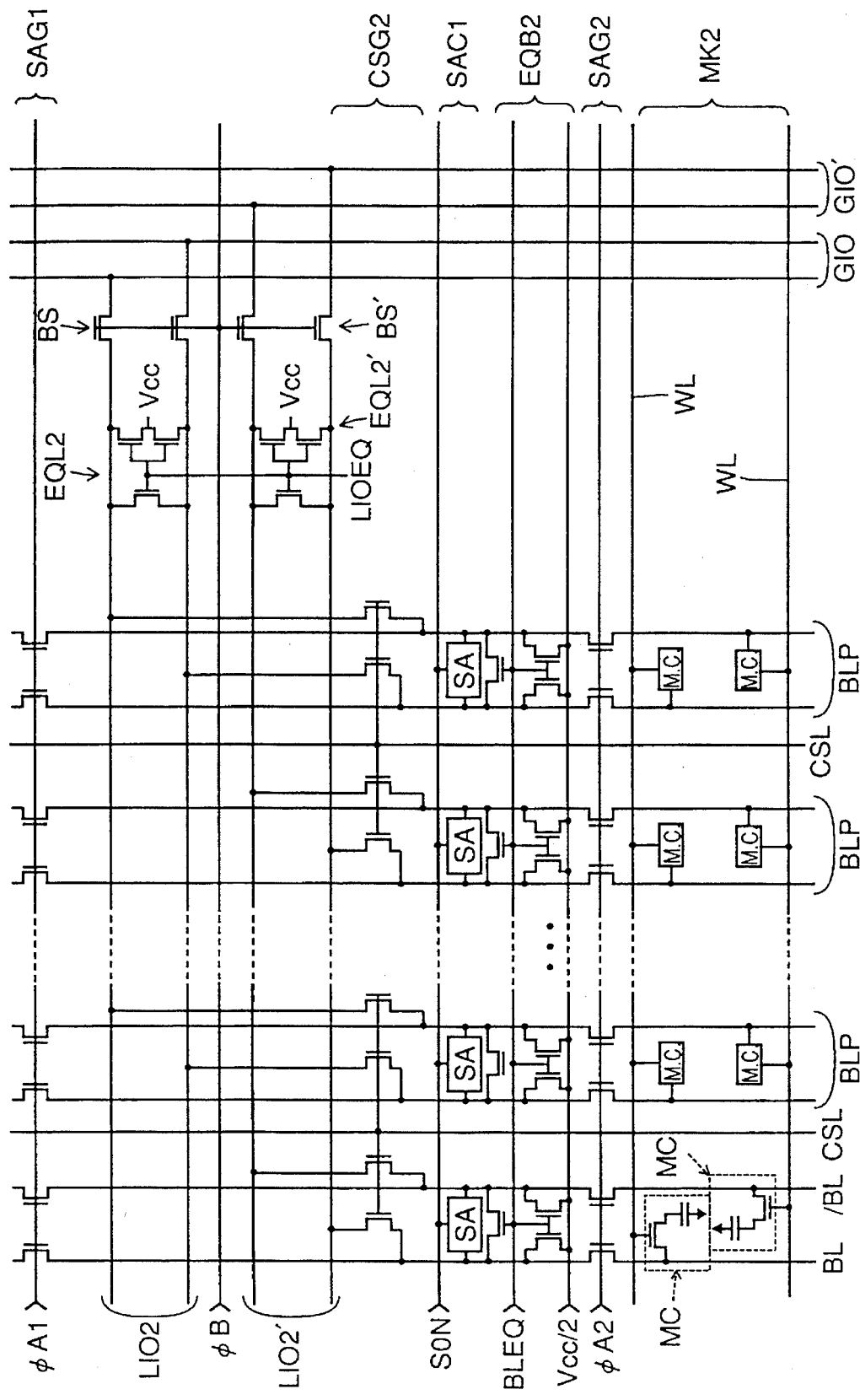
FIG. 31 is a circuit block diagram showing a structure of a part related to one 32-K bit memory array of the memory array shown in FIG. 30.
Figure 32:
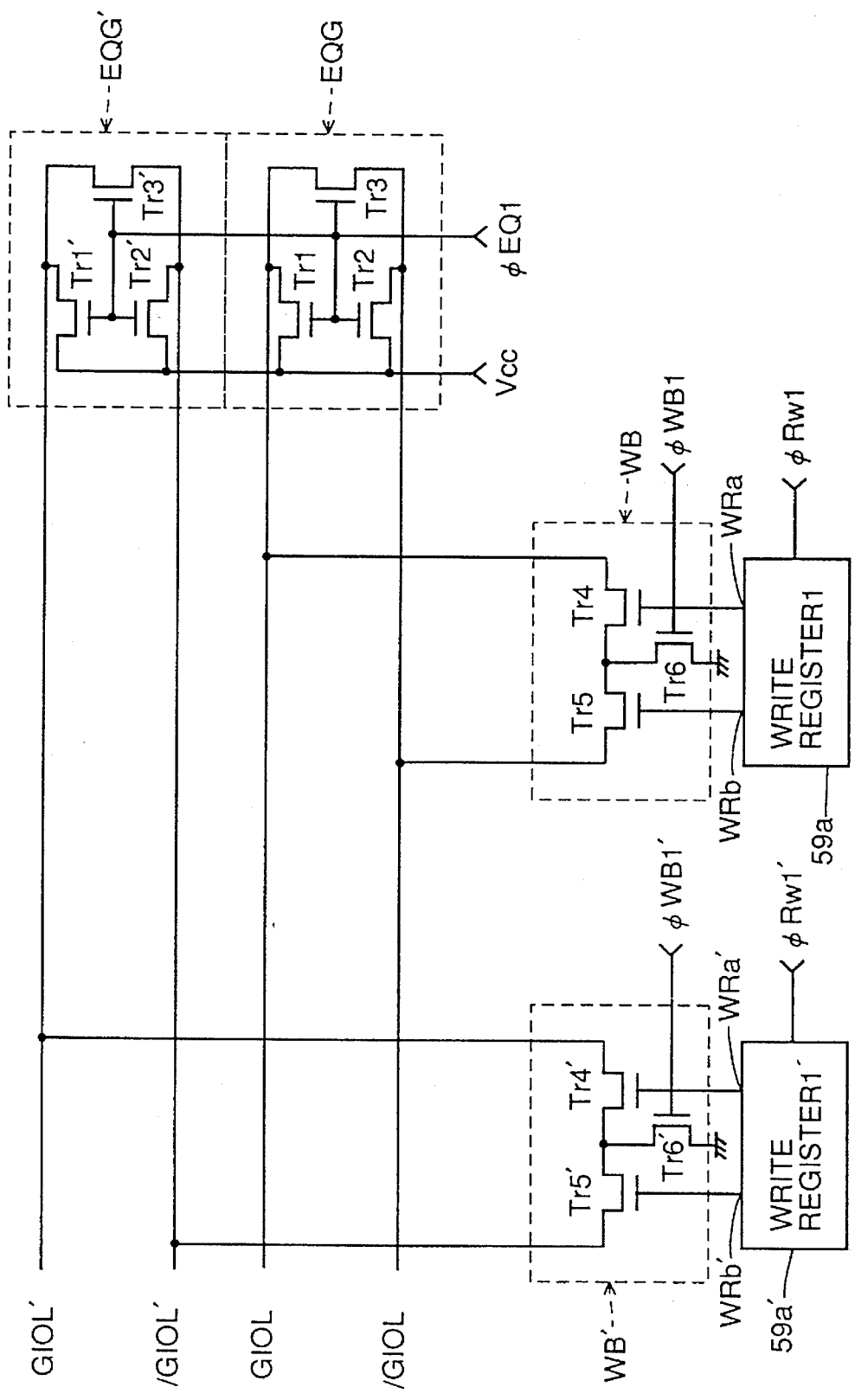
FIG. 32 is a circuit block diagram showing a structure of a part related to writing operation of the SDRAM shown in FIG. 29.
Figure 33:
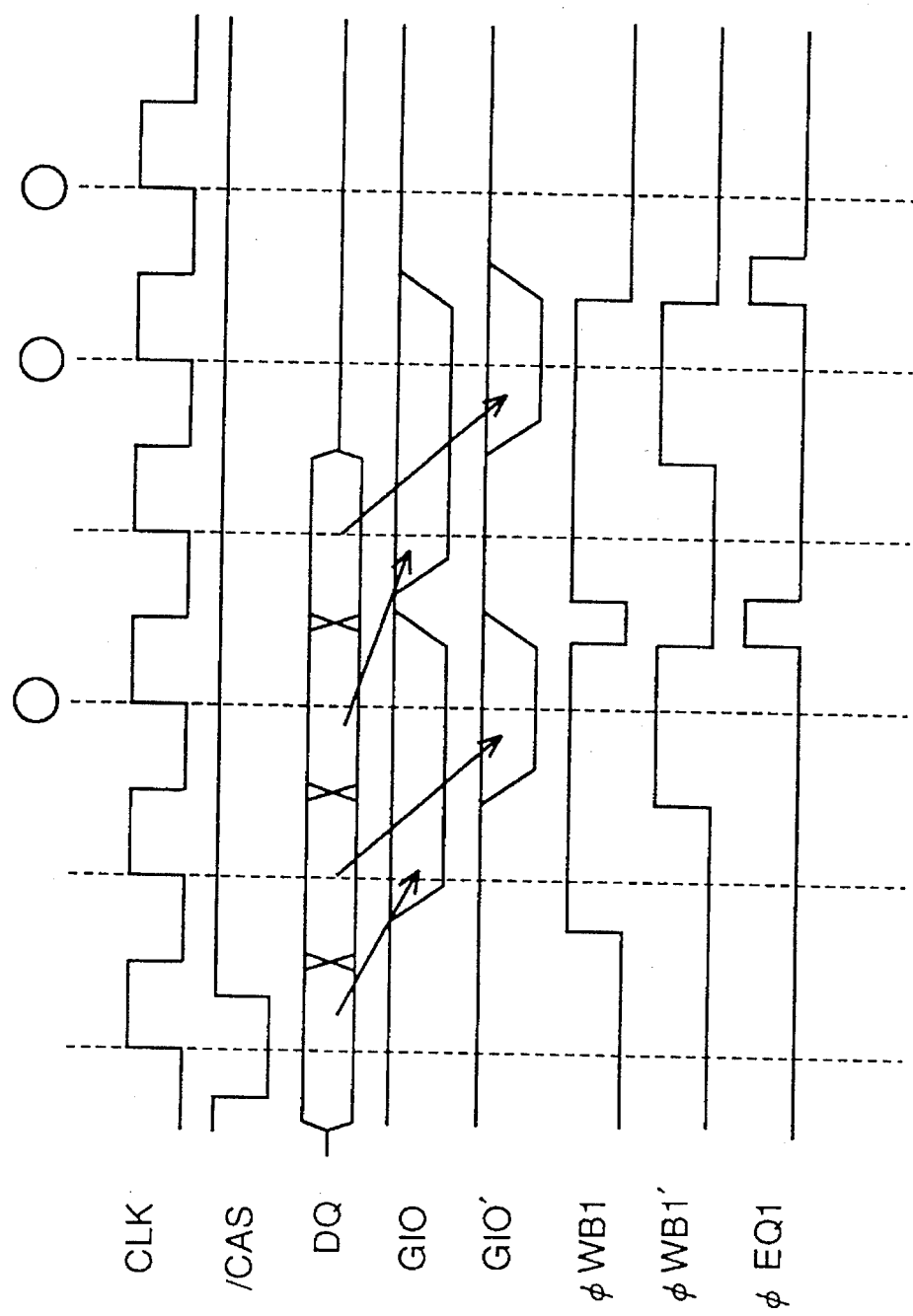
FIG. 33 is a timing chart showing change of external signals and a potential of a global IO line pair in continuous writing operation of the SDRAM shown in FIG. 29.

FIG. 4 is a circuit block diagram specifically showing a structure of a part related to writing operation of the SDRAM shown in FIG. 1. This figure is compared to FIG. 26. Referring to FIG. 4, switch 3a includes two common contacts 6 and 7, and four switch contacts 8 to 11. Common contacts 6 and 7 are connected to the drains of MOS transistors Tr4 and Tr5 of write buffer WB, respectively. Switch contacts 8, 9, 10 and 11 are connected to global IO lines GIOL, GIOL', /GIOL, and /GIOL', respectively.

When internal clock signal 2CLK is at the H level, contacts 6 and 8, and 7 and 10 are rendered conductive, and when internal clock signal 2CLK is at the L level, contacts 6 and 9, and 7 and 11 are rendered conductive. Therefore, when internal clock signal 2CLK is at the H level, global IO line pair GIO is connected to write buffer WB, and when internal clock signal 2CLK is at the L level, global IO line pair GIO' is connected to write buffer WB.

Switch 4a includes two common contacts 12 and 13, and four switch contacts 14 to 17. Common contacts 12 and 13 are connected to the sources of MOS transistors Tr1 and Tr2 of global IO line equalize circuit EQG, respectively. Switch contacts 14, 15, 16 and 17 are connected to global IO lines GIOL, GIOL', /GIOL, and /GIOL', respectively.

When internal clock signal 2CLK is at the H level, contacts 12 and 14, and 13 and 16 are rendered conductive, and when internal clock signal 2CLK is at the L level, contacts 12 and 15, and 13 and 17 are rendered conductive. Therefore, when internal clock signal 2CLK is at the H level, global IO line pair GIO' is connected to global IO line equalize circuit EQG, and when internal clock signal 2CLK is at the L level, global IO line pair GIO is connected to global IO line equalize circuit EQG.

Figure 6:
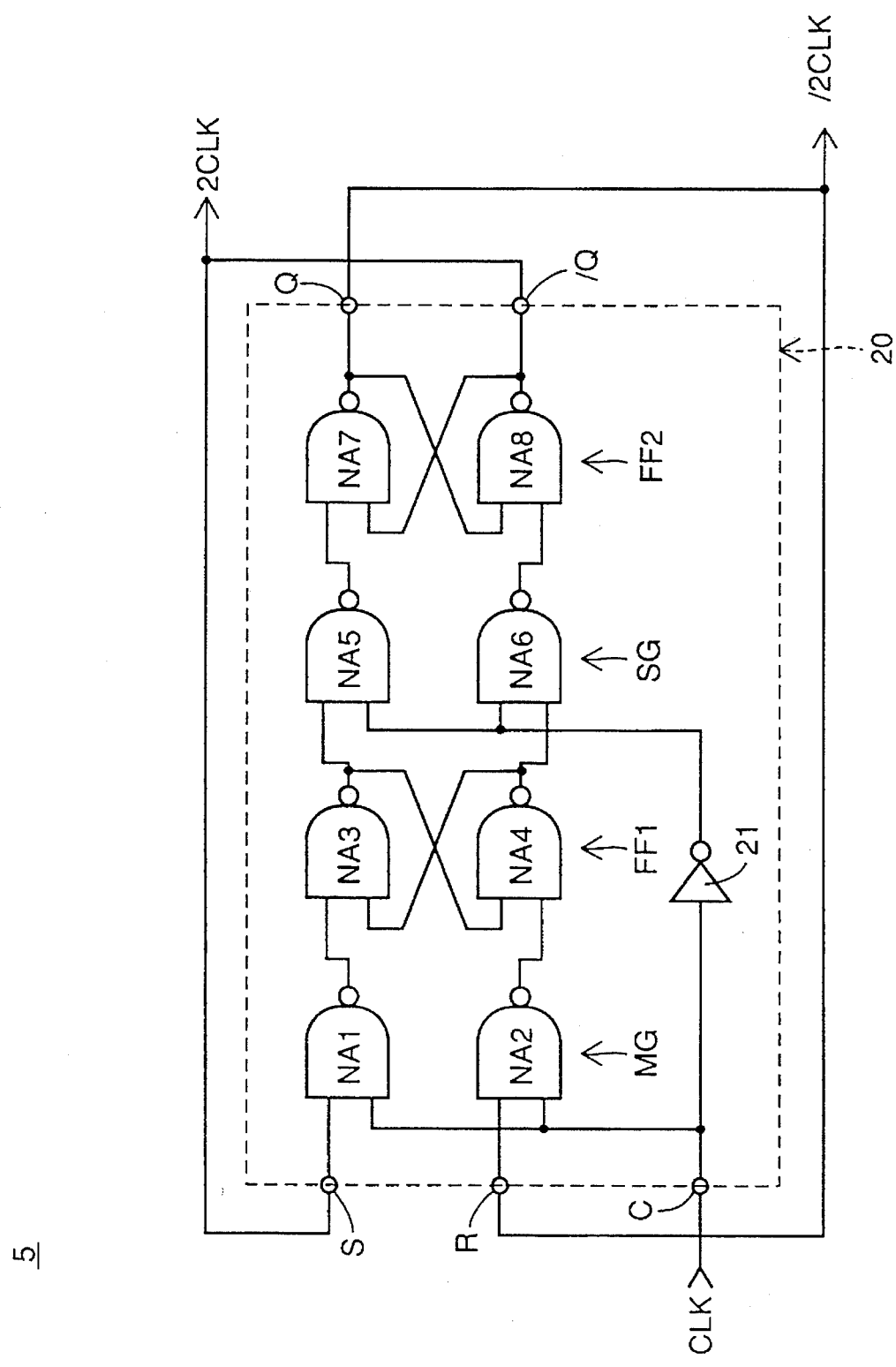
FIG. 6 is a circuit block diagram illustrating a structure of a double period circuit of the SDRAM shown in FIG. 1.

Note that one unit of the switch is formed of an N channel MOS transistor Tr7 connected between common contact 6 and one switch contact 8 and receiving internal clock signal 2CLK at its gate, and an N channel MOS transistor Tr8 connected between common contact 6 and the other switch contact 9 and receiving the inversion signal /2CLK of the internal clock signal, for example, as shown in FIG. 6.

Since switch 2a for alternately connecting global IO line pairs GIO and GIO' to preamplifier group 55a is the same as switch 3a, the description thereof will not be repeated.

FIG. 6 is a circuit block diagram showing a structure of double period circuit 5 of the SDRAM shown in FIG. 1. Referring to FIG. 6, double period circuit 5 includes a master sleeve flip-flop 20. Master sleeve flip-flop 20 receives external clock signal CLK at its clock terminal C. An output terminal Q is connected to a reset terminal R, and an inversion output terminal Q is connected to a set terminal S.

Master sleeve flip-flop 20 includes NAND gates NA1 to NA8 and an inverter 21. NAND gates NA1 and NA2, NA3 and NA4, NA5 and NA6, and NA7 and NA8 configure a master gate MG, a master flip-flop FF1, a sleeve gate SG, and a sleeve flip-flop FF2, respectively.

Figure 7:
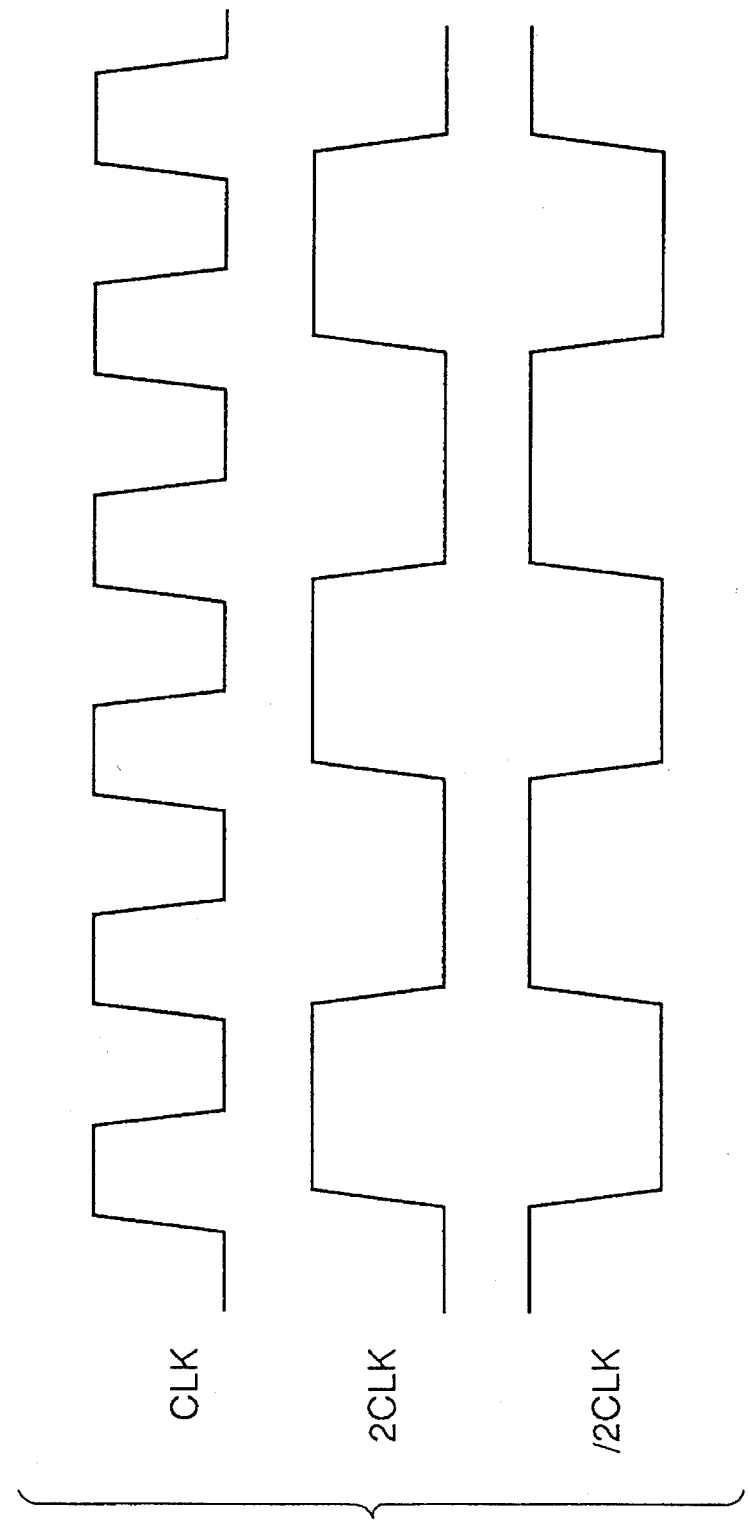
FIG. 7 is a timing chart showing operation of the double period circuit shown in FIG. 6.
Figure 8:
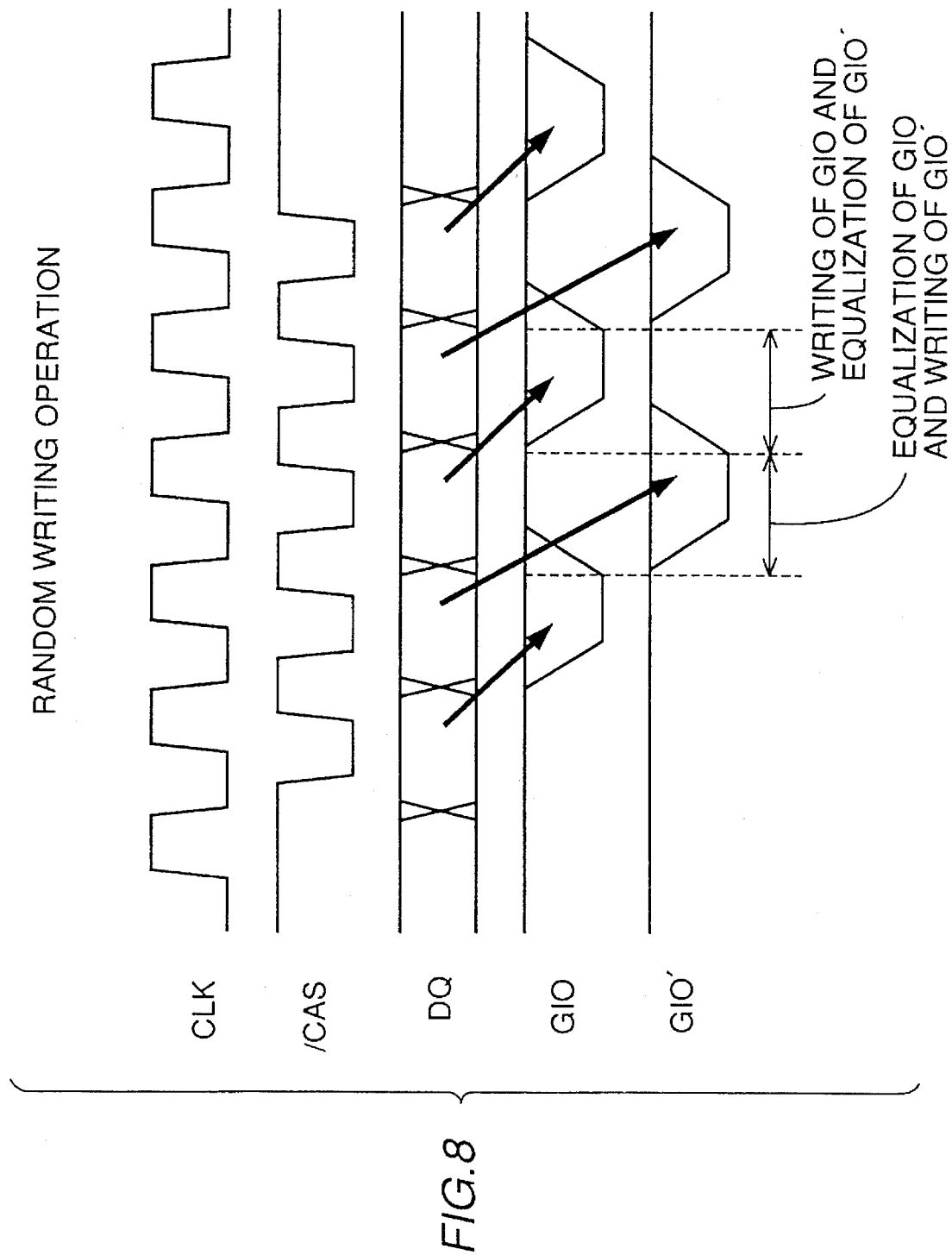
FIG. 8 is a timing chart showing random writing operation of the SDRAM shown in FIG. 1.

The levels of terminals S and R are transmitted to master flip-flop FF1 through master gate MG when external clock signal CLK attains the H level, and further transmitted to sleeve flip-flop FF2 through sleeve gate SG when external clock signal CLK attains the L level. The output of sleeve flip-flip FF1 is fed back to reset terminal R, and an inversion output thereof is fed back to set terminal S. Therefore, the levels of terminals Q and /Q are inverted on a clock cycle basis, respectively. As shown in FIG. 7, internal clock signal 2CLK which is obtained by frequency-dividing external clock signal CLK into two is outputted from terminal Q, and the inversion signal /2CLK of the internal clock signal is outputted from terminal Q.

Operation of the SDRAM shown in FIGS. 1 to 7 will now be described. For simplicity of description, the case will be described in which memory cells MC of two columns adjacent to each other of memory array block MK2 shown in FIG. 2 are selected continuously.

Reading operation will first be described. Data of memory cell MC selected first is read out externally during one clock cycle through a path of bit line pair BLP of the column→ array selecting gate SAG2→column selecting gate CSG2→ local IO line pair LIO2→block selecting switch BS→global IO line pair GIO→switch 2a→preamplifier group 55a→ read register 56a→output buffer 57a→data input/output terminal DQi.

Data of memory cell MC selected next is read out externally during one clock cycle through a path of bit line pair BLP of the column→array selecting gate SAG2→ column selecting gate CSG2'→local IO line pair LIO2'→ clock selecting switch BS'→global IO line pair GIO'→ switch 2a→preamplifier group 55a→read register 56a→ output buffer 57a→data input/output terminal DQi.

Writing operation will now be described. Data to memory cell MC selected first is written in the memory cell MC during one clock cycle through a path of data input/output terminal DQi→input buffer 58a→write register 59a→write buffer group 60a→switch 3a→global IO line pair GIO→ block selecting switch BS→local IO line pair LIO→column selecting gate CSG2→array selecting gate SAG2→bit line pair BLP. Further, during this one clock cycle, the other global IO line pair GIO' is equalized.

Data to memory cell MC selected next is written in the memory cell MC during one clock cycle through a path of data input/output terminal DQi→input buffer 58a→write register 59→write buffer group 60a→switch 3a→global IO line pair GIO'→block selecting switch BS'→local IO line pair LIO'→column selecting gate CSG2'→array selecting gate SAG2→bit line pair BLP. Further, during this one clock cycle, the other global IO line pair GIO is equalized.

Since two global IO line pairs GIO and GIO' are provided in this embodiment, data may be written through one global IO line pair GIO during one clock cycle, and the other global IO line pair GIO' may be equalized during the one clock cycle. Therefore, as compared to the conventional case where data are written through one global IO line pair GIO during one clock cycle, and then the global IO line pair GIO is equalized, data can be written easily at a high frequency.

Further, only one data input/output circuit including preamplifier group 55a and the like is provided, and each of two global IO line pairs GIO and GIO' is alternately connected to the data input/output circuit by switches 2a, 3a and 4a. Therefore, increase of a layout area can be suppressed.

Further, since wrap addresses WY0 to WY7 for register selection are not required in this SDRAM, a register control circuit 67 does not output wrap addresses WY0 to WY7.

[Second Embodiment]

Division of a global IO line pair and a local IO line pair into two systems as in the first embodiment causes increase of a chip area. Therefore, in this embodiment, only a global IO line pair having a longer interconnection length and a larger stray capacitance is divided into two systems, and a local IO line pair having a shorter interconnection length and a smaller stray capacitance is not divided into two systems, whereby writing at a high frequency is facilitated, and increase of the chip area is suppressed.

Figure 9:
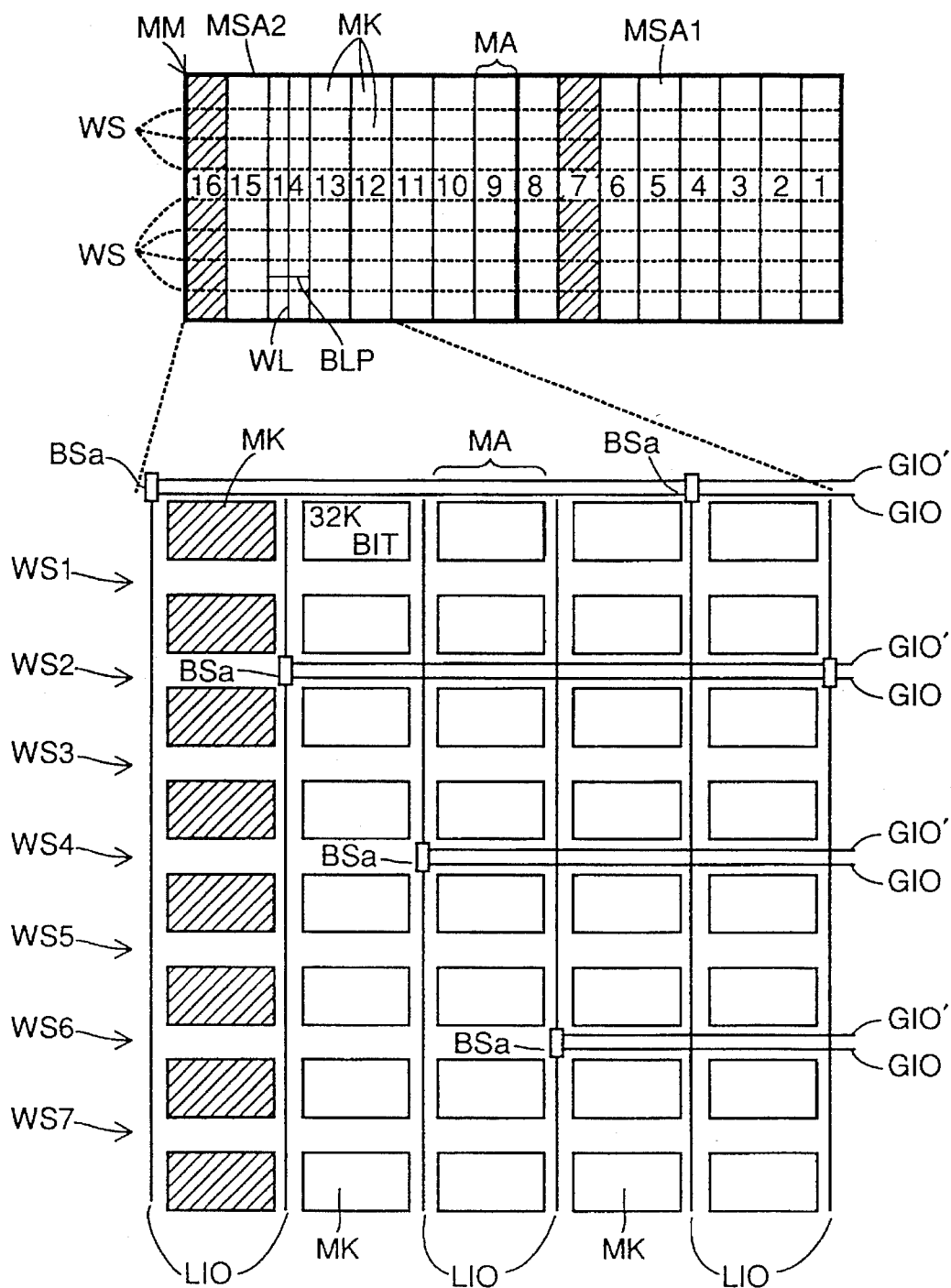
FIG. 9 is a diagram specifically showing arrangement of IO line pairs of a memory array of an SDRAM according to a second embodiment of the present invention.
Figure 21:
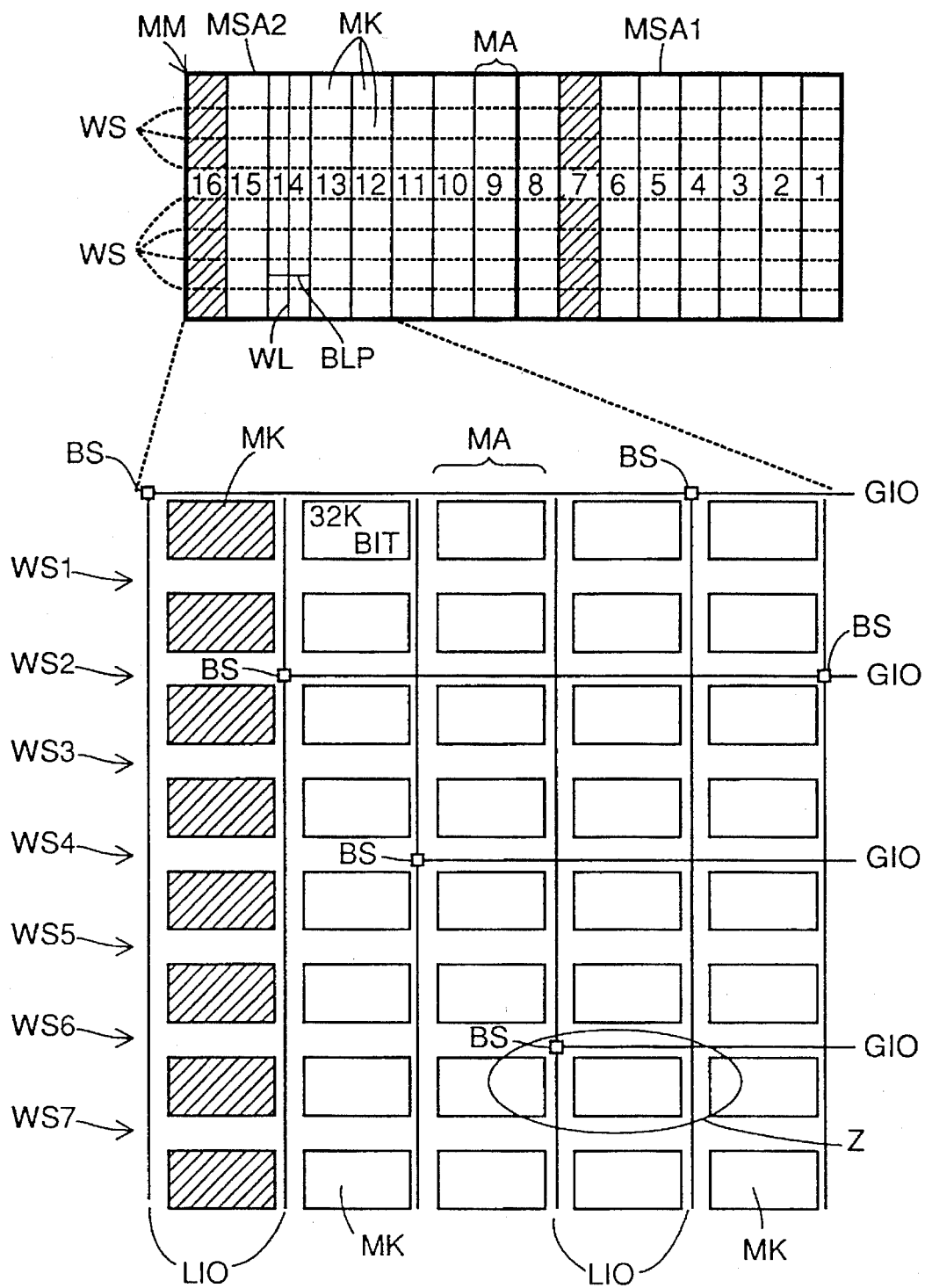
FIG. 21 specifically illustrates arrangement of IO line pairs of a memory array of the chip shown in FIG. 19.
Figure 22:
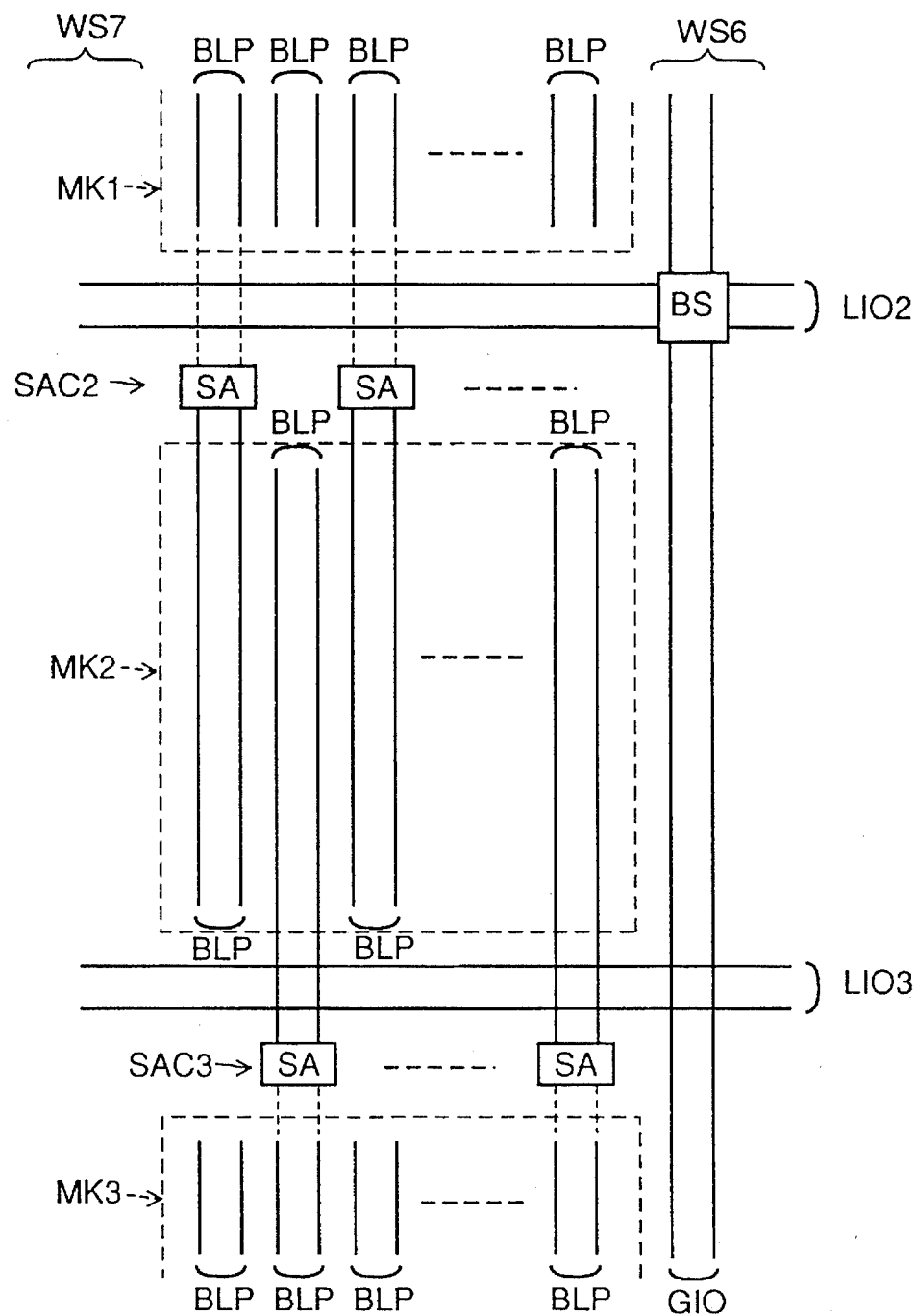
FIG. 22 shows the Z portion of FIG. 21 in an enlarged scale.

FIG. 9 specifically shows arrangement of IO lines of the SDRAM according to the second embodiment of the present invention. This figure is compared to FIG. 21. Referring to FIG. 9, in this SDRAM, two global IO line pairs GIO and GIO' and one local IO line pair LIO are provided. Block selecting switches BSa are provided at intersections of each local IO line pair LIO and global IO line pairs GIO and GIO' corresponding thereto. Block selecting switches BSa connect local IO line pair LIO to global IO line pairs GIO and GIO' corresponding thereto alternately on a clock cycle basis.

Figure 10:
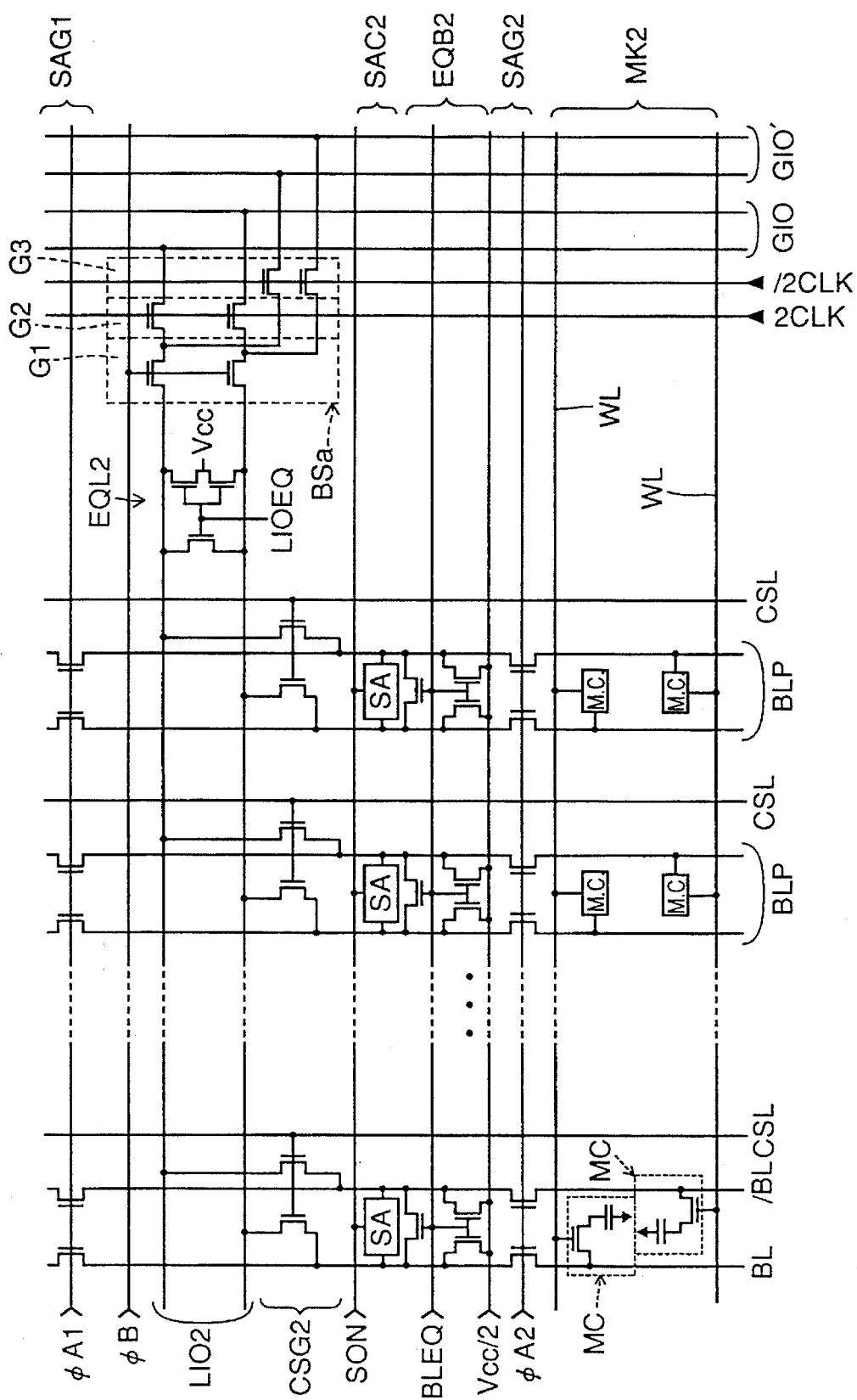
FIG. 10 is a circuit block diagram showing a structure of a part related to one 32-K bit memory array of the memory array shown in FIG. 9.

FIG. 10 is a circuit block diagram showing a structure of a part related to one 32-K bit memory array MK of the SDRAM. This figure is compared to FIG. 23.

Block selecting switch BSa includes three gates G1, G2 and G3. Gates G1 and G2 are connected in series between local IO line pair LIO2 and global IO line pair GIO. Gate G3 is connected between gate G1 and global IO line pair GIO'.

Gate G1 is rendered conductive in response to array selection signal φB, gate G2 is rendered conductive in response to internal clock signal 2CLK, and gate G3 is rendered conductive in response to the inversion signal /2CLK of the internal clock signal.

Operation of the SDRAM shown in FIGS. 9 and 10 will be described. For simplicity of description, the case is described where memory cells MC of two columns adjacent to each other of memory array block MK2 shown in FIG. 9 are continuously selected. Since operation of the data input/ output circuit including preamplifier group 55a and the like is the same as that of the first embodiment, the description will not be repeated.

In reading operation, data of memory cell MC selected first is read out externally during one clock cycle through a path of bit line pair BLP of the column→array selecting gate SAG2→column selecting gate CSG2→local IO line pair LIO2→gate G1→gate G2→global IO line pair GIO.

Data of memory cell MC selected next is read out externally during the next one clock cycle through a path of bit line pair BLP of the column→array selecting gate SAG2→column selecting gate CSG2→local IO line pair LIO2→gate G1→gate G3→global IO line pair GIO'.

In writing operation, data to memory cell MC selected first is written in the memory cell MC during one clock cycle through a path of global IO line pair GIO→gate G2→gate G1→local IO line pair LIO2→column selecting gate CSG2→bit line pair BLP. Local IO line pair LIO2 is equalized during this one clock cycle. Global IO line pair GIO is equalized during the next one clock cycle.

Data to memory cell MC selected next is written in the memory cell MC through a path of global IO line pair GIO'→gate G3→gate G1→local IO line pair LIO2→column selecting gate CSG2→bit line pair BLP. Local IO line pair LIO2 is equalized during this one clock cycle. Global IO line pair GIO' is equalized during the next one clock cycle.

Figure 11:
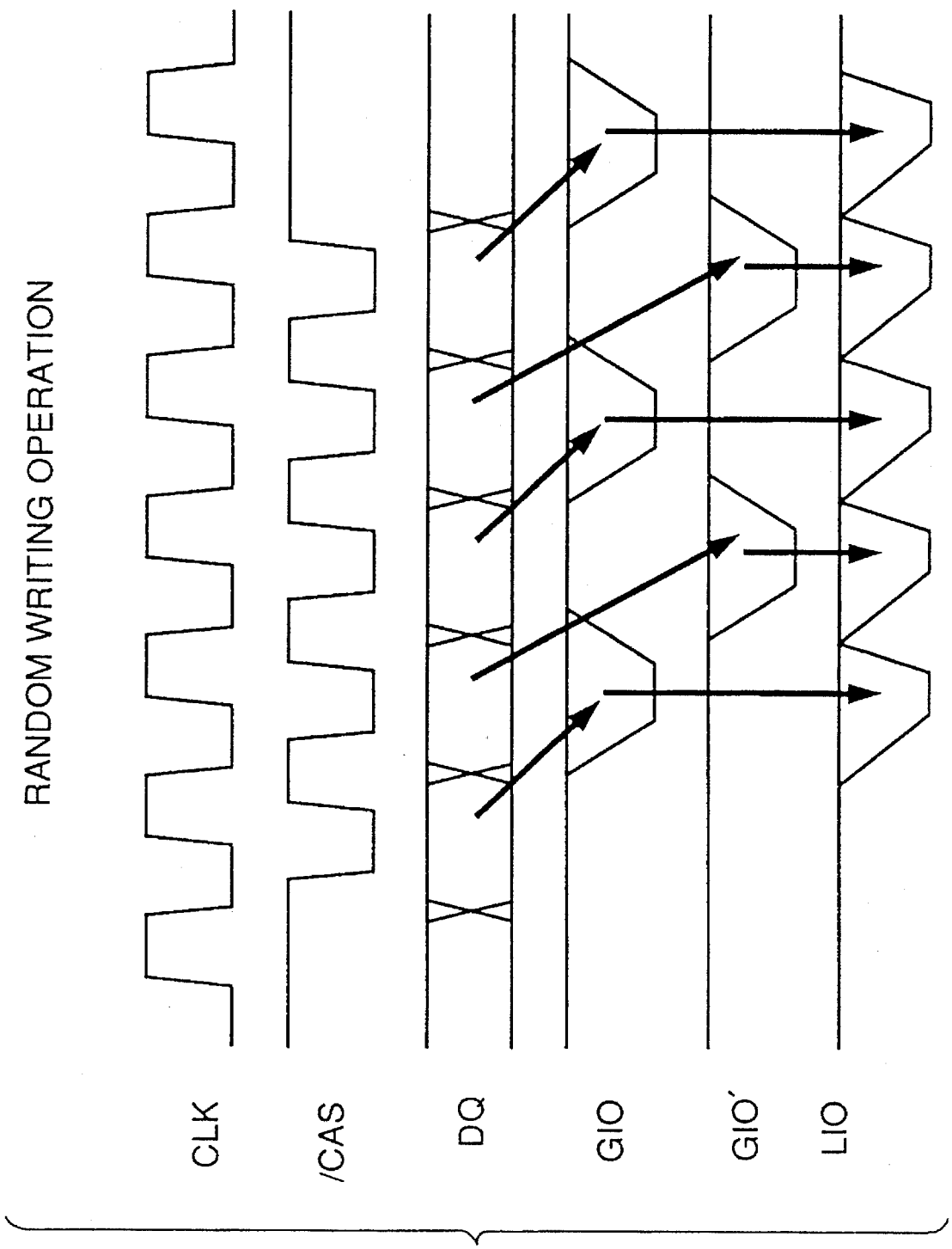
FIG. 11 is a timing chart showing random writing operation of the SDRAM shown in FIG. 9.

Since two global IO line pairs GIO and GIO' are provided in this embodiment, writing of data through one global IO line pair GIO and equalization of the other global IO line pair GIO can be carried out in parallel during one clock cycle, as shown in FIG. 11. Therefore, as compared to the conventional case where writing of data through one global IO line pair GIO and equalization of the global IO line pair GIO must be carried out in series during one clock cycle, writing of data can be carried out more easily at a high frequency.

Further, since local IO line pair LIO is not divided into two systems, increase of the chip area can be suppressed.

As to local IO line pair LIO, writing of data and equalization must be carried out in series during one clock cycle. However, since local IO line pair LIO has a shorter interconnection length and a smaller stray capacitance, no problem occurs.

[Third Embodiment]

In the second embodiment, the local IO line pair is not divided into two systems, and the global IO line pair divided into two systems is provided in word line shunt region WS. Therefore, in the second embodiment, the chip area is more reduced than the case of the first embodiment. However, since the number of transistors of block selecting switch BSa for connecting local IO line pair LIO and global IO line pairs GIO and GIO' increases, the chip area becomes larger than the conventional case. In this embodiment, it is intended to further reduce the chip area.

Figure 12:
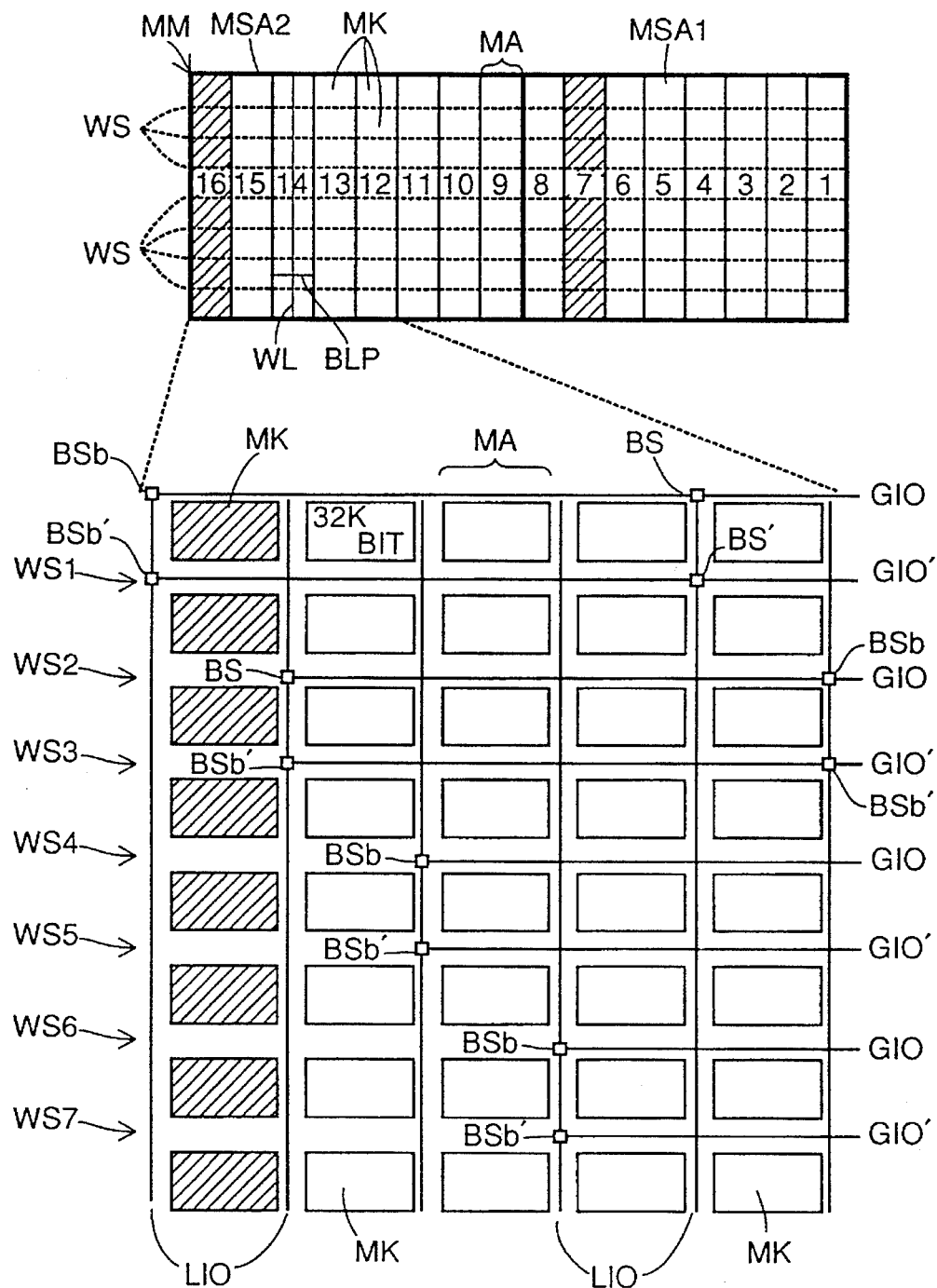
FIG. 12 is a diagram specifically showing arrangement of IO line pairs of a memory array of an SDRAM according to a third embodiment of the present invention.

FIG. 12 specifically illustrates arrangement of IO lines of the SDRAM according to the third embodiment of the present invention. Referring to FIG. 12, in this SDRAM, respective ones of two global IO line pairs GIO and GIO' provided in an end portion of memory mat MM, and word line shunt regions WS2, WS4 and WS6, respectively, in the SDRAM of FIG. 9 are moved to adjacent word line shunt regions WS1, WS3, WS5, WS7, and each block selecting switch BSa is divided into block selecting switches BSb and BSb'. Local IO line pair LIO is connected alternately to corresponding global IO line pairs GIO and GIO' on a clock cycle basis by block selecting switches BSb and BSb'.

Figure 13:
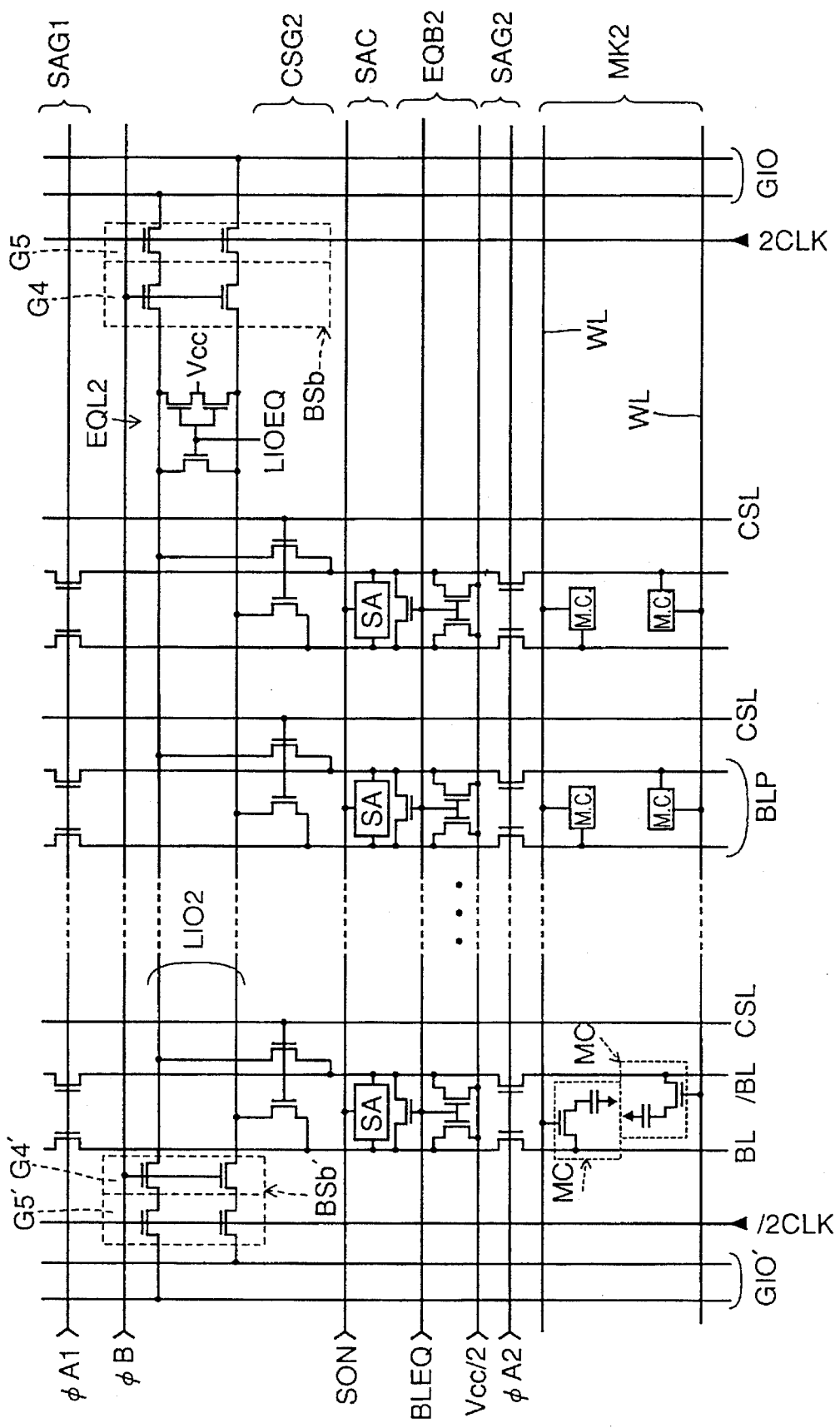
FIG. 13 is a circuit block diagram showing a structure of a part related to one 32-K bit memory array of the memory array shown in FIG. 12.

FIG. 13 is a circuit block diagram showing with one part omitted a structure of a part related to one 32-K bit memory array MK of the SDRAM shown in FIG. 12.

Block selecting switch BSb includes gates G4 and G5 connected in series between local IO line pair LIO and global IO line pair GIO. Block selecting switch BSb' includes gates G4' and G5' connected in series between local IO line pair LIO2 and global IO line pair GIO'. Gates G4 and G4' are rendered conductive in response to array selection signal φB, gate G5 is rendered conductive in response to internal clock signal 2CLK, and gate G5' is rendered conductive in response to the inversion signal /2CLK of the internal clock signal. Since operation is the same as that of the second embodiment, the description thereof will not be repeated.

In this embodiment, two global IO line pairs GIO and GIO' are provided in different word line shunt regions WS. Therefore, block selecting switch BSb connecting local IO line pair LIO and one global IO line pair GIO and block selecting switch BSb' connecting local IO line pair LIO and the other global IO line pair GIO' can be provided in different word line shunt regions WS, whereby increase of the chip area caused by increase of the number of transistors of the block selecting switch can be prevented.

[Fourth Embodiment]

Figure 14:
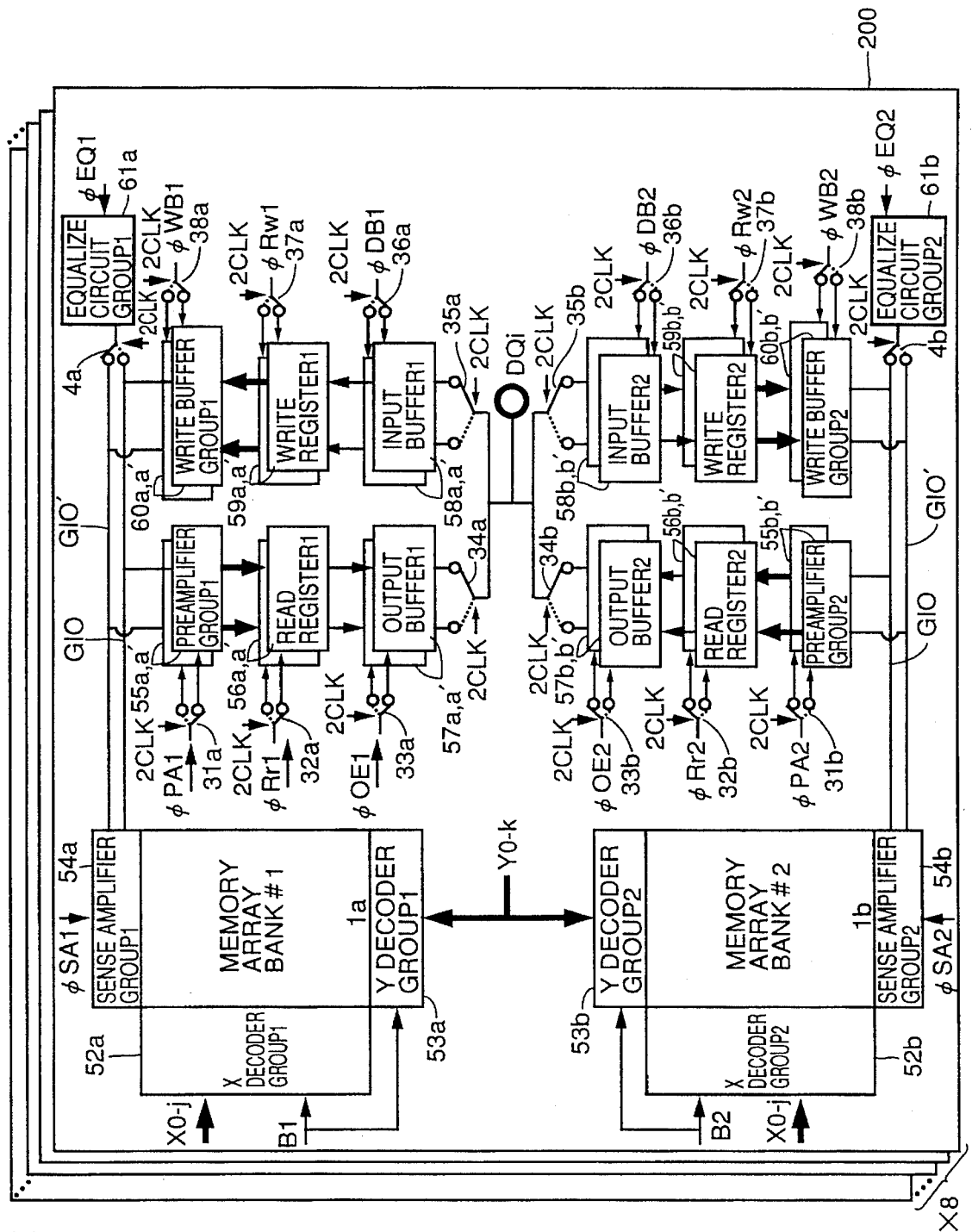
FIG. 14 is a block diagram functionally showing a structure of an SDRAM according to a fourth embodiment of the present invention.

FIG. 14 is a block diagram functionally showing a structure of a main part of the SDRAM according to the fourth embodiment of the present invention.

Referring to FIG. 14, in each functional block 200 of the SDRAM, preamplifier group 55a, read register 56a and output buffer 57a, and input buffer 58a, write register 59a and write buffer group 60a are provided corresponding to one global IO line pair GIO, and preamplifier group 55a', read register 56a' and output buffer 57a', and input buffer 58a, write register 59a' and write buffer group 60a' are provided corresponding to the other global IO line pair GIO'.

Switches 31a, 32a and 33a are provided for alternately activating input buffer 58a, write register 59a and write buffer 60a provided corresponding to one global IO line pair GIO, and preamplifier group 55a', read register 56a' and output buffer 57a' provided corresponding to the other global IO line pair GIO on a clock cycle basis in response to internal clock signal 2CLK.

Switches 36a, 37a and 38a are provided for alternately activating input buffer 58a, write register 59a and write buffer group 60a provided corresponding to one global IO line pair GIO, and input buffer 58a', write register 59a' and write buffer group 60a' provided corresponding to the other global IO line pair GIO' on a clock cycle basis in response to internal clock signal 2CLK.

A switch 34a is provided for alternately connecting preamplifier group 55a, read register 56a and output buffer 57a provided corresponding to one global IO line pair GIO, and preamplifier group 55a', read register 56a' and output buffer 57a' provided corresponding to the other global IO line pair GIO' to data input/output terminal DQi on a clock cycle basis in response to internal clock signal 2CLK.

A switch 35a is provided for alternately connecting input buffer 58a, write register 59a and write buffer group 60a provided corresponding to one global IO line pair GIO, and input buffer 58a', write register 59a' and write buffer group 60a' provided corresponding to the other global IO line pair GIO' to data input/output terminal DQi on a clock cycle basis in response to internal clock signal 2CLK. Other than the above, this SDRAM has the same configuration as that of FIG. 1.

Figure 15:
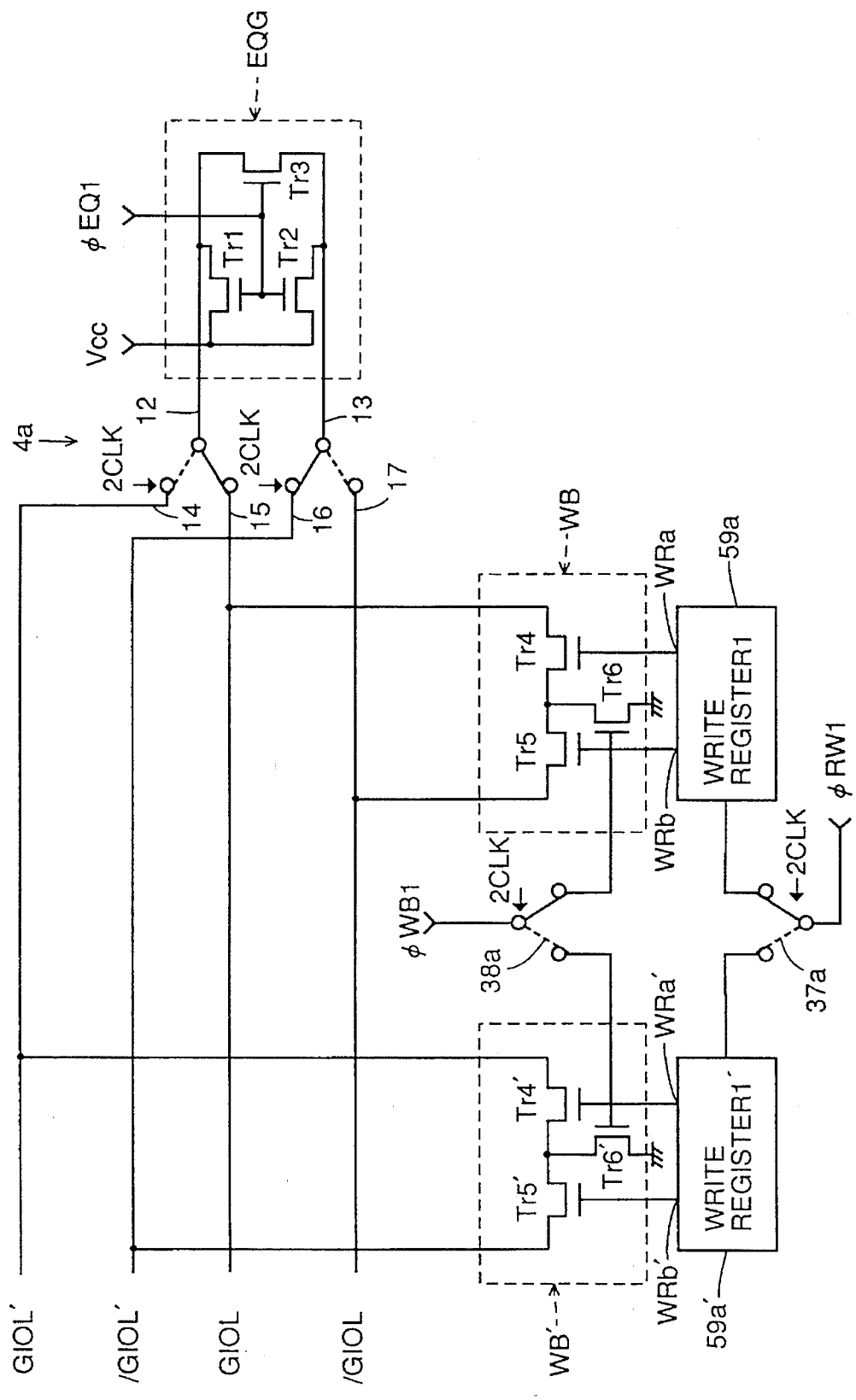
FIG. 15 is a circuit block diagram showing a structure of a part related to writing operation of the SDRAM shown in FIG. 14.

FIG. 15 specifically illustrates a structure of a part related to writing operation of the SDRAM shown in FIG. 14.

In the figure, write register 59a and write buffer WB provided corresponding to one global IO line pair GIO, write register 59a' and write buffer WB' provided corresponding to the other global IO line pair GIO', and equalize circuit EQG provided in common to two global IO line pairs GIO and GIO' are shown.

In addition, switch 37a for inputting register activation signal φRw1 to write registers 59a and 59a' alternately on a clock cycle basis, switch 38a for inputting write buffer activation signal φWB1 to write buffers WB and WB' alternately on a clock cycle basis, and switch 4a for connecting global IO line equalize circuit EQG to global IO line pairs GIO' and GIO alternately on a clock cycle basis are shown.

Operation of the SDRAM shown in FIGS. 14 and 15 will now be described. Reading operation will first be described. In the first one clock cycle, activation signals φPA1, φRr1 and φOE1 are inputted to preamplifier group 55a, read register 56a and output buffer 57a through switches 31a, 32a and 33a, and data of one global IO line pair GIO is read out externally through a path of preamplifier group 55a→read register 56a→output buffer 57a→switch 34a→data input/output terminal DQi.

In the next one clock cycle, activation signals φPA1, φRr1 and φOE1 are inputted to preamplifier group 55a', read register 56a' and output buffer 57a' through switches 31a, 32a and 33a, and data of the other global IO line pair GIO' is read out externally through a path of preamplifier group 55a'→read register 56a'→output buffer 57a'→switch 34a→data input/output terminal DQi.

Writing operation will now be described. In the first one clock cycle, activation signals φDB, φRw1 and φWB1 are inputted to input buffer 58a, write register 59a and write buffer group 60a through switches 36a, 37a and 38a, and data applied to data input/output terminal DQi is written in a desired memory cell MC through a path of switch 35a→ input buffer 58a→write register 59a→write buffer group 60a→global IO line pair GIO. During this one clock cycle, global IO line pair GIO' is equalized.

In the next one clock cycle, activation signals φDB, φRw1 and φWB1 are inputted to input buffer 58a', write register 59a' and write buffer group 60a' through switches 36a, 37a and 38a, and data applied to data input/output terminal DQi is written in a desired memory cell MC through a path of switch 35a→input buffer 58a'→write register 59a'→write buffer group 60a'→global IO line pair GIO'. During this one clock cycle, global IO line pair GIO is equalized.

Also in this embodiment, the similar effect as that of the first embodiment can be obtained.

[Fifth Embodiment]

In this embodiment, an SDRAM is shown which includes the advantage of the SDRAM of pipeline operation and that of the SDRAM of 2-bit prefetch described in the section of Description of the Background Art, and which has the same memory array structure as that of the conventional SDRAM.

The structure of the SDRAM of this embodiment is the same as that of the SDRAM of 2-bit prefetch described in the section of Description of the Background Art (cf. FIGS. 29 to 33 in particular). However, control timings are different.

Figure 16:
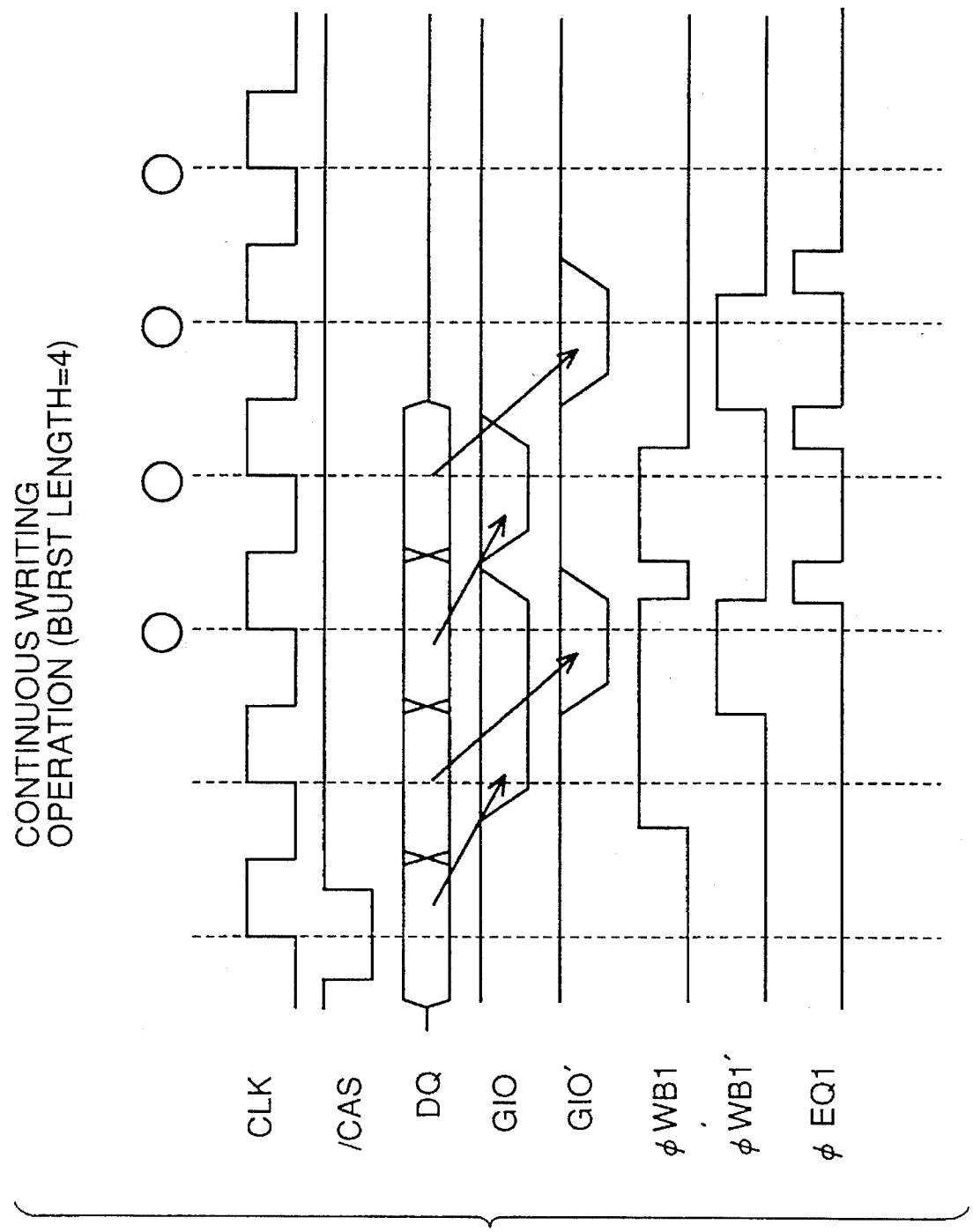
FIG. 16 is a timing chart showing continuous writing operation of an SDRAM according to a fifth embodiment of the present invention.

FIG. 16 is a timing chart showing continuous writing operation (burst length=4) of the SDRAM. This figure is compared to FIG. 33. Referring to FIG. 16, control timings of the SDRAM are different from those of FIG. 33 in that, after two clocks have passed since input of a write command, equalize circuit activation signal φEQ1 is activated every one clock, and global IO line pairs GIO and GIO' are equalized.

Figure 17:
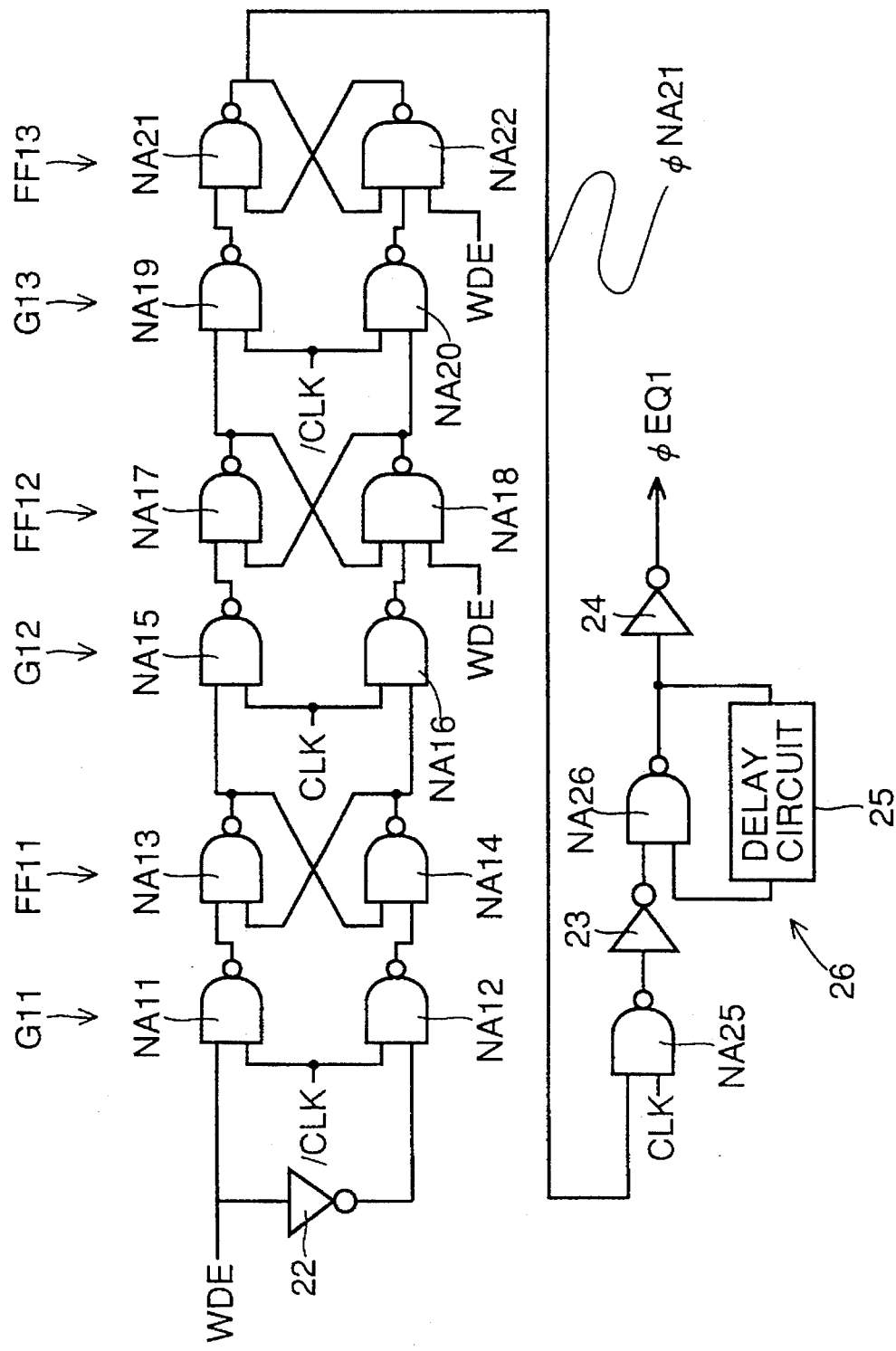
FIG. 17 is a circuit block diagram showing a structure of a signal generating circuit for generating equalize circuit activation signal $\phi EQ1$ of the SDRAM explained in FIG. 16.
Figure 18:
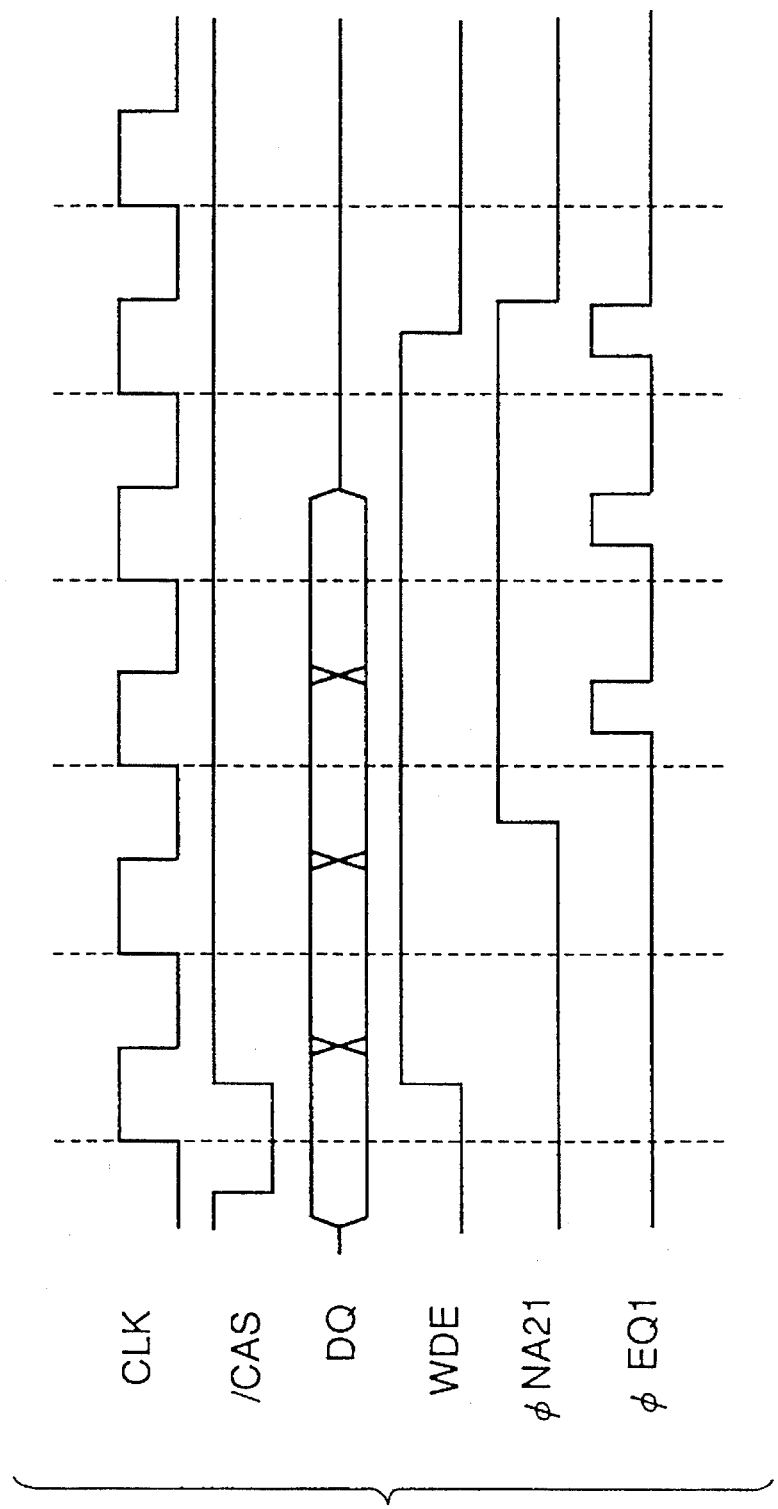
FIG. 18 is a timing chart showing operation of the signal generating circuit shown in FIG. 17.

FIG. 17 is a circuit block diagram illustrating a structure of a signal generating circuit for generating equalize circuit activation signal φEQ1 shown in FIG. 18.

Referring to FIG. 17, the signal generating circuit includes NAND gates NA11 to NA26, inverters 22 to 24, and a delay circuit 25. NAND gates NA11 and NA12, NA15 and NA16, and NA19 and NA20 configure gates G11, G12 and G13, respectively. Gate G12 is controlled by clock signal CLK, and gate G11 and G13 are both controlled by an inversion signal /CLK of the clock signal.

NAND gates NA13 and NA14, NA17 and NA18, and NA21 and NA22 configure flip-flops FF11, FF12, and FF13, respectively. Flip-flips FF12 and FF13 are both activated in response to a signal WDE. NAND gate NA26 and delay circuit 25 configure a pulse generating circuit 26.

Signal WDE is activated upon start of writing operation, and deactivated after clock signals CLK are counted for burst length. When the inversion signal /CLK of the clock signal attains the H level, the level of signal WDE is transmitted to flip-flop FF11 through gate G11. Then, when clock signal CLK attains the H level, the level of signal WDE is further transmitted to flip-flop FF12 through gate G12. When the inversion signal /CLK of the clock signal attains the H level, the level of signal WDE is further transmitted to flip-flop FF13 through gate G13.

NAND gate NA25 receives an output φNA21 of flip-flop FF13 and clock signal CLK. The output of NAND gate NA25 is inputted to pulse generating circuit 26 through inverter 23. The output of pulse generating circuit 26 is inputted to inverter 24. The output of inverter 24 forms equalize circuit activation signal φEQ1.

FIG. 18 is a timing chart showing operation of the signal generating circuit of FIG. 17. In response to signal /CAS attaining the L level in an active state and a write command being inputted, signal WDE attains the H level in an active state. After clock signals CLK are counted for burst length (after four clocks in this case), signal WDE attains the L level.

Signal φNA21 attains the H level in response to clock signal CLK changing from the L level to the H level and further changing back to the L level after signal WDE attains the H level. Signal φNA21 attains the L level in response to signal WDE attaining the L level. Pulse generating circuit 26 outputs a pulse signal having a prescribed duration in response to clock signal CLK attaining the H level while sinal φNA21 is at the H level. The pulse signal is inverted by inverter 24, and formed into equalize circuit activation signal φEQ1.

In this embodiment, global IO line pairs GIO and GIO' are equalized alternately for every one clock after two clocks have passed since input of a command of continuous writing. Therefore, it is possible to stop writing at timings of o in FIG. 16, and to write data at a newly inputted address. Therefore, random writing on a bit basis can be implemented. In addition, since two clock cycles are allocated to the first data writing in which a write time is shortened due to generation of an internal signal, this embodiment can follow speed-up of operation frequency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device strobing an external signal including a control signal, an address signal, and a data signal in response to an external clock signal, comprising:

a memory array including a plurality of memory cells arranged in rows and columns;

first and second signal input/output line pairs for inputting/outputting the data signal to and from said memory array;

a frequency division circuit frequency-dividing said external clock signal and outputting an internal clock signal having a period a plurality of times that of the external clock signal;

a selection circuit continuously selecting any memory cell of said memory array according to said address signal;

a switching circuit responsive to said internal clock signal outputted from said frequency division circuit for connecting each of the memory cells selected by said selection circuit to one ends of said first and second signal input/output line pairs alternately on a clock cycle basis; and a data input/output circuit responsive to said internal clock signal outputted from said frequency division circuit for receiving and transmitting the data signal to and from the other ends of said first and second signal input/output terminal pairs alternately on a clock cycle basis.

2. The synchronous semiconductor memory device according to claim 1, wherein said data input/output circuit includes a data reading circuit provided in common to said first and second signal input/output line pairs, a first switching circuit responsive to said internal clock signal for connecting the other ends of said first and second signal input/output line pairs to said data reading circuit alternately on a clock cycle basis, a data writing circuit provided in common to said first and second signal input/output line pairs, a second switching circuit responsive to said internal clock signal for connecting the other ends of said first and second signal input/output line pairs to said data writing circuit alternately on a clock cycle basis, an equalize circuit provided in common to said first and second signal input/output line pairs, and a third switching circuit responsive to said internal clock signal for connecting the other ends of said second and first signal input/output line pairs to said equalize circuit alternately on a clock cycle basis.

3. The synchronous semiconductor memory device according to claim 1, wherein said data input/output circuit includes a first data reading circuit provided corresponding to said first signal input/output line pair, a second data reading circuit provided corresponding to said second signal input/output line pair, a first switching circuit responsive to said internal clock signal for outputting externally data signals read out by said first and second data reading circuits alternately on a clock cycle basis, a first data writing circuit provided corresponding to said first signal input/output line pair, a second data writing circuit provided corresponding to said second signal input/output line pair, a second switching circuit responsive to said internal clock signal for externally inputting data signals to said first and second data writing circuits alternately on a clock cycle basis, an equalize circuit provided in common to said first and second signal input/output line pairs, and a third switching circuit responsive to said internal clock signal for connecting the other ends of said second and first signal input/output line pairs to said equalize circuit alternately on a clock cycle basis.

4. A synchronous semiconductor memory device strobing an external signal including a control signal, an address signal, and a data signal in synchronization with an external clock signal, comprising:

a memory array including a plurality of memory cells arranged in rows and columns;

first and second signal input/output line pairs for inputting and outputting the data signal to and from said memory array;

a selection circuit continuously selecting any memory cell pair of said memory array according to said address signal;

a connection circuit connecting each of the memory cell pairs selected by said selection circuit to one ends of said first and second signal input/output line pairs; and a data input/output circuit transmitting and receiving data signals of two bits to and from the other ends of said first and second signal input/output line pairs at a time in the first two clock cycles, and transmitting and receiving a data signal of one bit to and from the other ends of said first and second signal input/output line pairs alternately on a clock cycle basis thereafter.

5. The synchronous semiconductor memory device according to claim 4, wherein said data input/output circuit includes a first data reading circuit provided corresponding to said first signal input/output line pair, a second data reading circuit provided corresponding to said second signal input/output line pair, a first switching circuit for externally outputting data signals read out by said first and second data reading circuits alternately on a clock cycle basis, a first data writing circuit provided corresponding to said first signal input/output line pair, a second data writing circuit provided corresponding to said second signal input/output line pair, a second switching circuit for externally inputting a data signal to said first and second data writing circuits alternately on a clock cycle basis, an equalize circuit provided in common to said first and second signal input/output line pairs, and a writing control circuit equalizing said first and second signal input/output line pairs by said equalize circuit after writing of said data signals of two bits by said first and second data writing circuits in said first two clock cycles, and equalizing said first and second signal input/output line pairs by said equalize circuit after writing of said data signal of one bit by said first or second data writing circuit in each one clock cycle thereafter.

6. A synchronous semiconductor memory device strobing an external signal including a control signal, an address signal, and a data signal in synchronization with an external clock signal, comprising:

a plurality of memory array blocks each including a plurality of memory cells arranged in rows and columns, a word line provided corresponding to each row, and a bit line pair provided corresponding to each column;

first and second local signal input/output line pairs provided corresponding to each of said plurality of memory array blocks;

first and second global signal input/output line pairs provided in common to said plurality of memory array blocks;

a frequency division circuit frequency-dividing said external clock signal and outputting an internal clock signal having a frequency a plurality of times that of the external clock signal;

a selection circuit continuously selecting any memory array block of said plurality of memory array blocks and any memory cell belonging to the memory array block according to said address signal;

a switching circuit responsive to said internal clock signal outputted from said frequency division circuit for connecting each of bit line pairs corresponding to the memory cells selected by said selection circuit to one ends of the first and second local signal input/output line pairs of a memory array block to which each bit line pair belongs alternately on a clock cycle basis;

a connection circuit connecting each of the other ends of the first and second local signal input/output line pairs of said memory array blocks selected by said selection circuit to said first and second global signal input/output line pairs; and a data input/output circuit responsive to said internal clock signal outputted from said frequency division circuit for transmitting and receiving the data signal to and from the other ends of said first and second global signal input/output line pairs alternately on a clock cycle basis.

7. The synchronous semiconductor memory device according to claim 6, wherein said data input/output circuit includes a data reading circuit provided in common to said first and second global signal input/output line pairs, a first switching circuit responsive to said internal clock signal for connecting the other ends of said first and second global signal input/output line pairs to said data reading circuit alternately on a clock cycle basis, a data writing circuit connected in common to said first and second global signal input/output line pairs, a second switching circuit responsive to said internal clock signal for connecting the other ends of said first and second global signal input/output line pairs to said data writing circuit alternately on a clock cycle basis, an equalize circuit provided in common to said first and second global signal input/output line pairs, and a third switching circuit responsive to said internal clock signal for connecting the other ends of said second and first global signal input/output line pairs to said equalize circuit alternately on a clock cycle basis.

8. The synchronous semiconductor memory device according to claim 6, wherein said data input/output circuit includes a first data reading circuit provided corresponding to said first global signal input/output line pair, a second data reading circuit provided corresponding to said second global signal input/output line pair, a first switching circuit responsive to said internal clock signal for externally outputting data signals read out by said first and second data reading circuits alternately on a clock cycle basis, a first data writing circuit provided corresponding to said first global signal input/output line pair, a second data writing circuit provided corresponding to said second global signal input/output line pair, a second switching circuit responsive to said internal clock signal for externally inputting a data signal to said first and second data writing circuits alternately on a clock cycle basis, an equalize circuit provided in common to said first and second global signal input/output line pairs, and a third switching circuit responsive to said internal clock signal for connecting the other ends of said second and first global signal input/output line pairs to said equalize circuit alternately on a clock cycle basis.

9. The synchronous semiconductor memory device according to claim 6, wherein each of said plurality of memory array blocks includes a plurality of word line shunt regions provided crossing said word line with a predetermined interval with each other, and a conductive line of a low resistance provided corresponding to each word line and connected to a corresponding word line in each word line shunt region, and said first and second global signal input/output line pairs are provided so as to longitudinally cross the word line shunt regions of at least one of said plurality of memory array blocks.

10. The synchronous semiconductor memory device according to claim 9, wherein said first and second global signal input/output line pairs are provided so as to longitudinally cross different word line shunt regions from each other.

11. A synchronous semiconductor memory device strobing an external signal including a control signal, an address signal, and a data signal in synchronization with an external clock signal, comprising:

a plurality of memory array blocks each including a plurality of memory cells arranged in rows and columns, a word line provided corresponding to each row, and a bit line pair provided corresponding to each column;

a local signal input/output line pair provided corresponding to each of said plurality of memory array blocks;

first and second global signal input/output line pairs provided in common to said plurality of memory array blocks;

a frequency division circuit frequency-dividing said external clock signal and outputting an internal clock signal having a period a plurality of times that of the external clock signal;

a selection circuit continuously selecting any memory array block of said plurality of memory array blocks and any memory cell belonging to the memory array block according to said address signal;

a connection circuit connecting each of bit line pairs corresponding to said memory cells selected by said selection circuit to one end of the local signal input/output line pair of a memory array block to which the bit line pair belongs;

a switching circuit responsive to said internal clock signal outputted from said frequency division circuit for connecting each of the other ends of the local signal input/output line pairs of said memory array blocks selected by said selection circuit to one ends of said first and second global signal input/output line pairs alternately on a clock cycle basis; and a data input/output circuit responsive to said internal clock signal outputted from said frequency division circuit for transmitting and receiving a data signal to and from the other ends of said first and second global signal input/output line pairs alternately on a clock cycle basis.

12. The synchronous semiconductor memory device according to claim 11, wherein said data input/output circuit includes a data reading circuit provided in common to said first and second global signal input/output line pairs, a first switching circuit responsive to said internal clock signal for connecting the other ends of said first and second global signal input/output line pairs to said data reading circuit alternately on a clock cycle basis, a data writing circuit provided in common to said first and second global signal input/output line pairs, a second switching circuit responsive to said internal clock signal for connecting the other ends of said first and second global signal input/output line pairs to said data writing circuit alternately on a clock cycle basis, an equalize circuit provided in common to said first and second global signal input/output line pairs, and a third switching circuit responsive to said internal clock signal for connecting the other ends of said second and first global signal input/output line pairs to said equalize circuit alternately on a clock cycle basis.

13. The synchronous semiconductor memory device according to claim 11, wherein said data input/output circuit includes a first data reading circuit provided corresponding to said first global signal input/output line pair, a second data reading circuit provided corresponding to said second global signal input/output line pair, a first switching circuit responsive to said internal clock signal for externally outputting data signals read out by said first and second data reading circuits alternately on a clock cycle basis, a first data writing circuit provided corresponding to said first global signal input/output line pair, a second data writing circuit provided corresponding to said second global signal input/output line pair, a second switching circuit responsive to said internal clock signal for externally inputting a data signal to said first and second data writing circuits alternately on a clock cycle basis, an equalize circuit provided in common to said first and second global signal input/output line pairs, and a third switching circuit responsive to said internal clock signal for connecting the other ends of said second and first global signal input/output line pairs to said equalize circuit alternately on a clock cycle basis.

14. The synchronous semiconductor memory device according to claim 11, wherein each of said plurality of memory array blocks includes a plurality of word line shunt regions provided crossing said word line with a predetermined interval with each other, and a conductive line of a low resistance provided corresponding to each word line and connected to a corresponding word line in each word line shunt region, and said first and second global signal input/output line pairs are provided so as to longitudinally cross word line shunt regions of at least one of said plurality of memory array blocks.

15. The synchronous semiconductor memory device according to claim 14, wherein said first and second global signal input/output line pairs are provided so as to longitudinally cross different word line shunt regions from each other.

16. A synchronous semiconductor memory device strobing an external signal including a control signal, an address signal, and a data signal in synchronization with an external clock signal, comprising:

a plurality of memory array blocks each including a plurality of memory cells arranged in rows and columns, a word line provided corresponding to each row, and a bit line pair provided corresponding to each column;

first and second local signal input/output line pairs provided corresponding to each of said plurality of memory array blocks;

first and second global signal input/output line pairs provided in common to said plurality of memory array blocks;

a selection circuit continuously selecting any memory array block of said plurality of memory array blocks and any memory cell pair belonging to the memory array block according to said address signal;

a first connection circuit connecting each of two bit line pairs corresponding to the memory cell pairs selected by said selection circuit to one ends of the first and second local signal input/output line pairs of a memory array block to which the two bit line pairs belong;

a second connection circuit connecting each of the other ends of the first and second local signal input/output line pairs of said memory array blocks selected by said selection circuit to one ends of said first and second global signal input/output line pairs on a two-clock-cycle basis; and a data input/output circuit transmitting and receiving data signals of two bits to and from the other ends of said first and second global signal input/output line pairs at a time in the first two clock cycles, and transmitting and receiving a data signal of one bit to and from the other ends of said first and second global signal input/output line pairs alternately on a clock cycle basis thereafter.

17. The synchronous semiconductor memory device according to claim 16, wherein said data input/output circuit includes a first data reading circuit provided corresponding to said first global signal input/output line pair, a second data reading circuit provided corresponding to said second global signal input/output line pair, a first switching circuit for externally outputting data signals read out by said first and second data reading circuits alternately on a clock cycle basis, a first data writing circuit provided corresponding to said first global signal input/output line pair, a second data wiring circuit provided corresponding to said second global signal input/output line pair, a second switching circuit for externally inputting a data signal to said first and second data writing circuits alternately on a clock cycle basis, an equalize circuit provided in common to said first and second global signal input/output line pairs, and a writing control circuit equalizing said first and second global signal input/output line pairs by said equalize circuit after writing of said data signals of two bits by said first and second data writing circuits in said first two clock cycles, and equalizing said first and second global signal input/output line pairs by said equalize circuit after writing of said data signal of one bit by said first or second data writing circuit in each one clock cycle thereafter.

18. The synchronous semiconductor memory device according to claim 16, wherein each of said plurality of memory array blocks includes a plurality of word line shunt regions provided crossing said word line with a predetermined interval with each other, and a conductive line of a low resistance provided corresponding to each word line and connected to a corresponding word line in each word line shunt region, and said first and second global signal input/output line pairs are provided so as to longitudinally cross word line shunt regions of at least one of said plurality of memory array blocks.

19. The synchronous semiconductor memory device according to claim 18, wherein said first and second global signal input/output line pairs are provided so as to longitudinally cross different word line shunt regions from each other.

* * * * *